United States Patent
Vijayasingh Gnanaprakasam

(10) Patent No.: US 11,949,510 B2
(45) Date of Patent: Apr. 2, 2024

(54) HARDWARE-BASED DYNAMIC CYCLIC-REDUNDANCY CHECK (CRC) GENERATOR FOR AUTOMOTIVE APPLICATION

(71) Applicant: QUALCOMM Incorporated, San Diego, CA (US)

(72) Inventor: Sunitha Annam Vijayasingh Gnanaprakasam, Bangalore (IN)

(73) Assignee: QUALCOMM Incorporated, San Diego, CA (US)

( * ) Notice: Subject to any disclaimer, the term of this patent is extended or adjusted under 35 U.S.C. 154(b) by 79 days.

(21) Appl. No.: 17/929,764

(22) Filed: Sep. 6, 2022

(65) Prior Publication Data
US 2024/0080133 A1 Mar. 7, 2024

(51) Int. Cl.
*H04L 1/00* (2006.01)
*H04L 12/40* (2006.01)

(52) U.S. Cl.
CPC .......... *H04L 1/0078* (2013.01); *H04L 1/0041* (2013.01); *H04L 1/0061* (2013.01); *H04L 12/40013* (2013.01)

(58) Field of Classification Search
CPC .................................................... H04L 1/0078
See application file for complete search history.

(56) References Cited

U.S. PATENT DOCUMENTS

| | | | | | |
|---|---|---|---|---|---|
| 5,282,215 | A * | 1/1994 | Hyodo | ............. | H04L 7/048 714/775 |
| 5,323,403 | A * | 6/1994 | Elliott | ............. | G06F 11/10 708/534 |
| 6,105,155 | A * | 8/2000 | Cheng | ............. | G06F 11/1008 714/736 |
| 6,226,771 | B1 * | 5/2001 | Hilla | ............. | H03M 13/09 714/776 |
| 6,848,072 | B1 * | 1/2005 | Milliken | ............. | H04L 1/0061 714/781 |
| 8,225,187 | B1 * | 7/2012 | Schultz | ............. | G06F 11/1004 714/807 |
| 10,171,108 | B1 | 1/2019 | Yan | | |

(Continued)

OTHER PUBLICATIONS

International Search Report and Written Opinion—PCT/US2023/026254—ISA/EPO—dated Oct. 16, 2023.

*Primary Examiner* — Joseph D Torres
(74) *Attorney, Agent, or Firm* — The Marbury Law Group, PLLC

(57) ABSTRACT

Embodiments include methods performed by a copy engine of a computing device for generating a cyclic redundancy check (CRC) in a safety network, including copying a first dataset received from an interface bus to obtain a first dataset copy, copying a second dataset received from the interface bus to obtain a second dataset copy, generating, via a first stream-wise CRC engine in the hardware of the copy engine, a first CRC value for the first dataset copy and, in parallel, generating, via a second stream-wise CRC engine in the hardware of the copy engine, a second CRC value for the second dataset copy, transmitting, to a processor of the computing device, a first stream-wise CRC message including the first dataset copy and the first CRC value, and a second stream-wise CRC message including the second dataset copy and the second CRC value.

30 Claims, 14 Drawing Sheets

(56) References Cited

U.S. PATENT DOCUMENTS

| | | | |
|---|---|---|---|
| 2004/0098655 A1* | 5/2004 | Sharma | H03M 13/091 714/758 |
| 2005/0172205 A1* | 8/2005 | Lin | H03M 13/091 714/758 |
| 2005/0188200 A1* | 8/2005 | Kwok | H04L 9/3273 713/168 |
| 2009/0086551 A1* | 4/2009 | Ide | G06F 11/1004 365/230.02 |
| 2016/0085618 A1 | 3/2016 | Mackay et al. | |
| 2018/0089137 A1* | 3/2018 | Ooi | G06F 11/3027 |
| 2021/0067173 A1 | 3/2021 | Miele | |

* cited by examiner

HARDWARE-BASED DYNAMIC CYCLIC-REDUNDANCY CHECK (CRC) GENERATOR FOR AUTOMOTIVE APPLICATION

BACKGROUND

A communications network may implement network devices that be communicatively coupled to each other according to various communication standards. In order to transfer data between other devices within a communications network, a network device must be configured or configurable to communicate according to the communication protocols utilized by the other devices. For example, a network device attempting to establish a communication link between a Bluetooth-capable device and another communication link between a Wi-Fi-capable device involves establishing a link and transferring data according to both the Bluetooth and WIFI standard protocols. Part of the communication link and data transfer process includes performing cyclic-redundancy checks (CRCs) that verify data payloads for data security and error prevention purposes. A network device attempting to transfer data to and from network devices implementing various communication protocols requires performing CRCs as defined by the various communications protocols.

SUMMARY

Various aspects include methods performed by a copy engine of a computing device for generating a cyclic redundancy check (CRC) in a safety network. Various aspects may include copying, in hardware of the copy engine, a first dataset received from an interface bus to obtain a first dataset copy, copying, in hardware of the copy engine, a second dataset received from the interface bus to obtain a second dataset copy, generating, via a first stream-wise CRC engine in the hardware of the copy engine, a first CRC value for the first dataset copy and, in parallel generating, via a second stream-wise CRC engine in the hardware of the copy engine, a second CRC value for the second dataset copy, transmitting, to a processor of the computing device, a first stream-wise CRC message including the first dataset copy and the first CRC value, and transmitting, to the processor, a second stream-wise CRC message including the second dataset copy and the second CRC value.

Some aspects may further include generating, based on a first communication message, a first source ring descriptor including a first source data pointer indicating a memory location of the first dataset, and generating, based on a second communication message, a second source ring descriptor including a second source data pointer indicating a memory location of the second dataset.

In some embodiments, copying, in hardware of the copy engine, the first dataset received from the interface bus to obtain the first dataset copy may further include copying the first dataset based on the first source data pointer, and copying, in hardware of the copy engine, the second dataset received from the interface bus to obtain the second dataset copy may further include copying the second dataset based on the second source data pointer.

In some embodiments, the first source ring descriptor may include a first length bit indicating a length of the first dataset, a first gather bit indicating the first CRC value is generated as part of a first dataset stream including multiple datasets, and a first CRC type indicating a first communication protocol, and the second source ring descriptor may include a second length bit indicating a length of the second dataset, a second gather bit indicating the second CRC value is generated as part of a second dataset stream including multiple datasets, and a second CRC type indicating a second communication protocol.

In some embodiments, generating, via the first stream-wise CRC engine, the first CRC value for the first dataset copy may further include generating, via the first stream-wise CRC engine, the first CRC value for the first dataset copy based on a first CRC type indicating a first communication protocol, and generating, via the second stream-wise CRC engine, the second CRC value for the second dataset copy may further include generating, via the second stream-wise CRC engine, the second CRC value for the second dataset copy based on a second CRC type indicating a second communication protocol.

In some embodiments, the first CRC type and the second CRC type may be different CRC types.

Some aspects may further include generating a first status ring descriptor including the first CRC value and a first status bit, generating a second status ring descriptor including the second CRC value and a second status bit, setting the first status bit after generating the first CRC value, in which transmitting the first stream-wise CRC message is performed in response to setting the first status bit, and setting the second status bit after generating the second CRC value, in which transmitting the second stream-wise CRC message is performed in response to setting the second status bit.

Some aspects may further include generating a first destination ring descriptor including a first destination data pointer, and generating a second destination ring descriptor including a second destination data pointer, in which transmitting the first stream-wise CRC message may further include transmitting the first stream-wise CRC message based on the first destination data pointer, and in which transmitting the second stream-wise CRC message may further include transmitting the second stream-wise CRC message based on the second destination data pointer.

Some aspects may further include copying, in hardware of the copy engine, a third dataset received from the interface bus to obtain a third dataset copy, in which generating, via the first stream-wise CRC engine in the hardware of the copy engine, the first CRC value for the first dataset copy and, in parallel generating, via the second stream-wise CRC engine in the hardware of the copy engine, the second CRC value for the second dataset copy may further include generating, via the first stream-wise CRC engine, a final CRC value, in which the final CRC value is generated using the third dataset copy and the first CRC value, and in which transmitting, to the processor, the first stream-wise CRC message may further include transmitting, to the processor, the first stream-wise CRC message including the first dataset copy, the third dataset copy, and the final CRC value.

Further aspects may include a computing device having a copy engine configured to perform operations of any of the methods summarized above. Further aspects may include a computing device having means for performing functions of any of the methods summarized above.

BRIEF DESCRIPTION OF THE DRAWINGS

The accompanying drawings, which are incorporated herein and constitute part of this specification, illustrate example embodiments, and together with the general description given above and the detailed description given below, serve to explain the features of various embodiments.

DETAILED DESCRIPTION

Figure 1A:
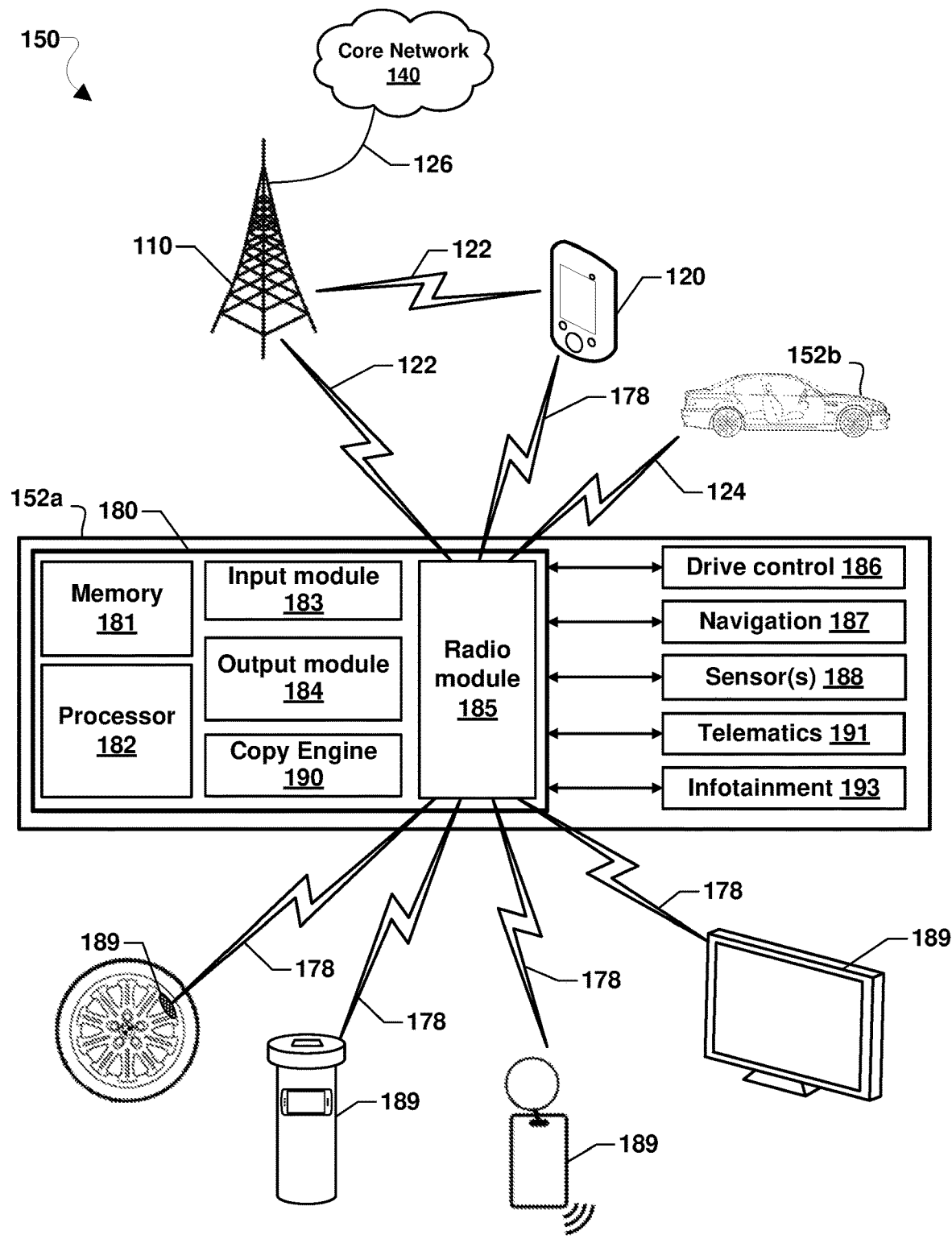
FIG. 1A is a component block diagram illustrating a safety network 150 of components and support systems suitable for implementing various embodiments

Various embodiments will be described in detail with reference to the accompanying drawings. Wherever possible, the same reference numbers will be used throughout the drawings to refer to the same or like parts. References made to particular examples and implementations are for illustrative purposes, and are not intended to limit the scope of the claims.

Various embodiments include hardware elements, and methods implemented in such hardware elements, for generating a cyclic redundancy check (CRC) or multiple CRCs in parallel in a network, such as an automobile network supporting a variety of safety-related subsystems.

Many different vehicle subsystems have safety-related functionality, such as sensor systems, brake systems, information displays, and the like, many of which require the exchange of data and commands with many other vehicle subsystems. Due to safety concerns, safety-related system need to exchange data across networks and data buses in a manner that is secure and reliable. One method for ensuring data exchanged between devices is communicated accurately involves including CRC information in message packets, which enable a receiving device to confirm the accuracy of packet data and correct some errors that can be introduced in transport. Complicating the secure exchange of data and commands among multiple vehicle subsystems is that many subsystems and devices connected to vehicle networks use different network protocols. Further, some subsystems and devices may exchange data via wireless communication links, including Bluetooth, Bluetooth Low Energy (BLE) and Wi-Fi, which use different protocols than devices that communicate data via wired networks of a vehicle. Different communication protocols may involve different CRC methods. Thus, various components and subsystems communicating on a vehicle network, particularly safety-related subsystems (referred to as "safety subsystems") exchanging data on a vehicle network may need to accommodate multiple different methods of generating and using CRC information.

Various embodiments include hardware solutions and methods for supporting stream-wise CRC generation for datasets communicated via various protocols. Various embodiments allow for parallel (e.g., in a same time window) generation and/or computation of CRC values for multiple datasets by implementing multiple stream-wise CRC engines in hardware of a copy engine that can be implemented within safety subsystems. Each stream-wise CRC engine may be allotted a channel, and may process multiple datasets of varying CRC types within a dataset stream (i.e. stack). Packet overhead for each dataset may be stored by and updated in software as source, status, and destination ring descriptors, thereby reducing the time for generating CRCs within the hardware-based stream-wise CRC engines. While particularly useful for vehicle systems, various embodiments may be useful in any network of components and subsystems that communicate data and commands using more than one communication protocol.

The term "computing device" is used herein to refer to any one or all of router devices (wired or wireless), appliances (wired or wireless), cellular telephones, smartphones, portable computing devices, personal or mobile multi-media players, laptop computers, tablet computers, smartbooks, ultrabooks, palmtop computers, wireless electronic mail receivers, multimedia Internet-enabled cellular telephones, medical devices and equipment, biometric sensors/devices, wearable devices including smart watches, smart clothing, smart glasses, smart wrist bands, smart jewelry (for example, smart rings and smart bracelets), entertainment devices (for example, wireless gaming controllers, music and video players, satellite radios, etc.), wireless-network enabled Internet of Things (IoT) devices including smart meters/sensors, industrial manufacturing equipment, large and small machinery and appliances for home or enterprise use, wireless communication elements within autonomous and semiautonomous vehicles, wireless devices affixed to or incorporated into various mobile platforms, global positioning system devices, and similar electronic devices that include a memory and a programmable processor. Computing devices that include wireless communication components and are configured to communicate with other computing devices via wireless communication links (e.g., cellular telephones, smartphones, etc.) are referred to herein as "wireless computing devices."

The term "system-on-a-chip" (SoC) is used herein to refer to a single integrated circuit (IC) chip that contains multiple resources and/or processors integrated on a single substrate. A single SoC may contain circuitry for digital, analog, mixed-signal, and radio-frequency functions. A single SoC may also include any number of general purpose and/or specialized processors (digital signal processors, modem processors, video processors, etc.), memory blocks (e.g., ROM, RAM, Flash, etc.), and resources (e.g., timers, voltage regulators, oscillators, etc.). SoCs may also include software for controlling the integrated resources and processors, as well as for controlling peripheral devices.

The term "system-in-a-package" (SiP) may be used herein to refer to a single module or package that contains multiple resources, computational units, cores and/or processors on two or more IC chips, substrates, or SoCs. For example, a SiP may include a single substrate on which multiple IC chips or semiconductor dies are stacked in a vertical configuration. Similarly, the SiP may include one or more multi-chip modules (MCMs) on which multiple ICs or semiconductor dies are packaged into a unifying substrate. A SiP may also include multiple independent SoCs coupled together via high speed communication circuitry and packaged in close proximity, such as on a single motherboard or in a single computing device. The proximity of the SoCs facilitates high speed communications and the sharing of memory and resources.

Network devices implementing various communication protocols may process cyclic redundancy checks (CRCs) and generate CRC values for error correction and data security purposes as defined by each communication protocols. Different communication protocols generate CRC values differently, and thus two components or subsystems that use different communications protocols may generate/use different CRC values. For example, devices, networks, and subsystems, such as an Advanced Driver Assistance Systems (ADAS) (i.e., a safety subsystem), may be in wireless communication with multiple network devices, such as multimedia distribution devices, entertainment displays, wireless mobile devices, wireless charging stations, tire pressure monitoring systems, keyless entry devices, and any other device capable of communicating with an ADAS within a safety network, some of which may use different CRC methods in the exchange of data over the same network.

A copy engine is a module in a safety subsystem network that handles data transfer from and to various network devices for all types of communication protocols including Ethernet, controller area network (CAN), serial transfer, secure digital (SD) transfer, double data rate (DDR) transfer, and WiFi, among others. Data integrity check recommendation processing for generating CRC values varies from one protocol to another protocol.

In automotive safety networks and subsystems, the recommended CRC processing steps may vary based on the standards implemented by devices and subsystems communicatively coupled to a safety subsystem (i.e., ADAS) within a safety network. A safety subsystem may therefore process and generate CRCs according to various standards as prescribed by AUTomotive Open System ARchitecture (AUTOSAR).

AUTOSAR is a development partnership of automotive interested parties pursuing the objective to create and establish an open and standardized software architecture for automotive electronic control units (ECUs). AUTOSAR seeks to include the scalability to different vehicle and platform variants, transferability of software, the consideration of availability and safety requirements, and maintainability during the product lifecycle. AUTOSAR recommends that an ADAS be compliant with various communications standards including but not limited to Automotive Hardware Functional Safety (FuSa) Features (e.g., ISO 26262), any Consultative Committee for International Telegraphy and Telephony (CCITT), algorithms for serial streams (e.g., Wide Area Network (WAN), radio communication protocol, Secure Digital, DigRF) modem standards, Ethernet standards, Bluetooth and Bluetooth Low Energy (BLE) standards, and AUTOSAR CRC standards and recommended protocols such as AUTOSAR safety polynomial CRC32P4 with 0xF4ACFB13 polynomial, SAE J1850 CRC8 for 0x1D polynomial used for diagnostics and data sharing applications in vehicles, and 8-bit 0x2F CRC for open safety communication protocol.

While the AUTOSAR specification recommends CRC for functional safety for all protocols and dictates new methods of CRC protocol for safety related protocols, various other standards may recommend different protocols. Dynamic compliance with all protocols recommended by AUTOSAR and other various standards is therefore a challenge, as each standard may have different requirements for generating and verifying CRCs when communicating data payloads between communicatively connected devices and subsystems. Traditional packet-wise CRC processing is done sequentially according to each standard, and may require CRC overhead of up to 50% of the total bit length of each associated data stack. Verifying CRC values according to a conventional packet-wise manner for each variant of communication protocol may therefore be computationally costly and time consuming.

Various embodiments minimize the processing performed by hardware for generating CRC values by offloading CRC overhead into data structures such as software-based ring descriptors. Various embodiments may generate and update a source ring descriptor, a status ring descriptor, and a destination ring descriptor for each dataset communicated to and from a network device. The ring descriptors may include metadata usable for identifying a source, destination, updated CRC value, CRC type, in addition to other CRC overhead fields or bits associated with a payload or dataset. Various embodiments may further generate CRCs in parallel by implementing multiple hardware-based stream-wise CRC engines in separate channels, in which each stream-wise CRC engine may process a dataset stream including multiple datasets of same or different CRC types. A CRC type may be an indicator representing which communication protocol a dataset was conveyed to and/or from a safety subsystem.

Various embodiments include computing devices for use in a safety network, including an interface bus through which communications including datasets are conveyed, and a copy engine coupled to the interface bus. The copy engine may include a copy engine buffer in hardware configured to store data sets as dataset copies, a first stream-wise CRC engine, and a second stream-wise CRC engine. The copy engine may be configured to copy a first dataset received from the interface bus to the copy engine buffer as a first dataset copy and copy a second dataset received from the interface bus to the copy engine buffer as a second dataset copy. The copy engine may be further configured to use the first stream-wise CRC engine to generate a first CRC value for the first dataset copy and use the second stream-wise CRC engine to generate a second CRC value for the second dataset copy. The copy engine may then transmit, via the interface bus to a processor of the computing device, a first stream-wise CRC message including the first dataset copy and the first CRC value and a second stream-wise CRC message including the second dataset copy and the second CRC value.

In some embodiments, the copy engine may be further configured to use the second stream-wise CRC engine to generate the second CRC value for the second dataset copy in parallel with using the first stream-wise CRC engine to generate the first CRC value.

In some embodiments, the copy engine may further include a memory-mapped subsystem configured to generate, based on a first communication message, a first source ring descriptor including a first source data pointer indicating a memory location of the first dataset. The memory-mapped subsystem may further be configured to generate, based on a second communication message, a second source ring descriptor including a second source data pointer indicating a memory location of the second dataset. In some embodiments, the copy engine may be further configured to copy the first dataset to the copy engine buffer based on the first source data pointer, and copy the second dataset to the copy engine buffer based on the second source data pointer.

In some embodiments, the copy engine may be further configured such that the first source ring descriptor includes a first length bit indicating a length of the first dataset, a first gather bit indicating the first CRC value is generated as part of a first dataset stream including multiple datasets, and a first CRC type indicating a first communication protocol. The copy engine may be further configured such that the second source ring descriptor includes a second length bit indicating a length of the second dataset, a second gather bit indicating the second CRC value is generated as part of a second dataset stream including multiple datasets, and a second CRC type indicating a second communication protocol.

In some embodiments, the copy engine may be further configured to use the first stream-wise CRC engine to generate the first CRC value for the first dataset copy based on a first CRC type indicating a first communication protocol, and use the second stream-wise CRC engine to generate the second CRC value for the second dataset copy based on a second CRC type indicating a second communication protocol, in which the first CRC type and the second CRC type are different CRC types.

In some embodiments, the memory-mapped subsystem may be configured to generate a first status ring descriptor including the first CRC value and a first status bit, generate a second status ring descriptor including the second CRC value and a second status bit, set the first status bit in response to the first stream-wise CRC engine generating the first CRC value, and set the second status bit in response to the second stream-wise CRC engine generating the second CRC value. The copy engine may be configured to transmit the first stream-wise CRC message via the interface bus in response to the memory-mapped subsystem setting the first status bit, and transmit the second stream-wise CRC message via the interface bus in response to the memory-mapped subsystem setting the second status bit.

In some embodiments, the memory-mapped subsystem may be further configured to generate a first destination ring descriptor including a first destination data pointer, and generate a second destination ring descriptor including a second destination data pointer. The copy engine may be configured to transmit the first stream-wise CRC message via the interface bus based on the first destination data pointer, and transmit the second stream-wise CRC message via the interface bus based on the second destination data pointer.

In some embodiments, the copy engine may be further configured to copy a third dataset received from the interface bus to copy engine buffer as a third dataset copy, use the first stream-wise CRC engine to generate a final CRC value using the third dataset copy and the first CRC value (i.e., the first dataset and the third dataset are part of a same data stream), and transmit, via the interface bus to the processor, the first stream-wise CRC message including the first dataset copy, the third dataset copy, and the final CRC value.

In various embodiments, multiple channel traffic in a network (e.g., a safety network) may be handled with different CRC types based on different communication protocol's recommendations (i.e., how the CRC is generated or otherwise calculated within hardware circuitry). Various embodiments address organizational, throughput, and processing issues associated with implementing all communications protocols recommended by AUTOSAR. As a result of (i) multiple-channel parallel CRC generation, (ii) hardware-based stream-wise CRC generation for data stream including multiple datasets, and (iii) offloading CRC overhead from hardware to software in the form of ring descriptor data structures, performance and efficiency of a safety subsystem is improved. More specifically, subsystem and safety network performance is improved due to the following features: CRC is calculated or otherwise generated in hardware, CRC is calculated or otherwise generated in a stream-wise manner instead of packet-wise and is updated in the status ring descriptor stored in a memory-mapped subsystem (e.g., firmware, DDR), CRC overhead is not added to the data payload or data buffer (i.e., instead stored separately as software-based ring descriptors), calculated CRC is handled by the software (i.e., a generated CRC value is updated within a software-based status ring descriptor), verification of the CRC checksum is done in software when data is consumed by the application, multiple channels handle different types of communication protocols and each data stream can include different CRC types, and processor interruption is minimized as the instructions are replaced with ring descriptors stored in bulk stacks (i.e., less interrupts). In other words, data transfer may be initiated for multiple channels supporting different types of protocols by programming the source and destination ring descriptors by software per channel, data transfer completion may be marked again in batches for a stack of ring descriptors with status ring descriptor being filled up by the hardware, and verification of CRC is handled by the software for a stream of data transfers in batches as programmed in the source descriptor. This reduces the processor intervention and frequent attention for every data transfer per channel.

FIG. 1A is a component block diagram illustrating a safety network 150 of components and support systems suitable for implementing various embodiments. With reference to FIG. 1A, a vehicle 152a may include a safety subsystem 180, which may include various circuits and devices used to control the operation of the vehicle 152a as well as communicate with other vehicles that are similarly equipped, such as a vehicle 152b. In the example illustrated in FIG. 1A, the safety subsystem 180 includes a radio module 185, a processor 182, memory 181, an input module 183, an output module 184, and a copy engine 190. The safety subsystem 180 may be coupled to and configured to control drive control components 186, navigation components 187, one or more sensor components 188 of the vehicle 152a, telematics components 191, and infotainment components 193.

A base station 110 may communicate with the core network 140 over a wired or wireless communication link 126. The wireless communication link 126 may use a variety of wired networks (e.g., Ethernet, TV cable, telephony, fiber optic and other forms of physical network connections) that may use one or more wired communication protocols, such as Ethernet, Point-To-Point protocol, High-Level Data Link Control (HDLC), Advanced Data Communication Control Protocol (ADCCP), and Transmission Control Protocol/Internet Protocol (TCP/IP).

A wireless computing device 120 and vehicles 152a and 152b may communicate with the base station 110 over a wireless communication link 122. The wireless communication links 122 and 124 may include a plurality of carrier signals, frequencies, or frequency bands, each of which may include a plurality of logical channels. The wireless communication links 122 and 124 may utilize one or more radio access technologies (RATs). Examples of RATs that may be used in a wireless communication link include 3GPP LTE, 3G, 4G, 5G (e.g., NR), GSM, Code Division Multiple Access (CDMA), Wideband Code Division Multiple Access (WCDMA), Worldwide Interoperability for Microwave Access (WiMAX), Time Division Multiple Access (TDMA), and other mobile telephony communication technologies cellular RATs. Further examples of RATs that may be used in one or more of the various wireless communication links within the communication system 100 include medium range protocols such as Wi-Fi, LTE-U, LTE-Direct, LAA, MuLTEfire, and relatively short-range RATs such as ZigBee, Bluetooth, and Bluetooth Low Energy (BLE). In some embodiments, the wireless communication links 122 and 124 may include direct connection communication links that may be established over a PC5 interface in accordance with applicable 3GPP standards.

The safety subsystem 180 may include a processor 182 that may be configured with processor-executable instructions to control maneuvering, navigation, and/or other operations of the vehicle 152a, including operations of various embodiments. The processor 182 may be coupled to the memory 166, copy engine 190, and the radio module 185, for example, through an interconnection or bus (e.g., advanced eXtensible interface (AXI)). The processor 182 may include one or more processing units. In some embodiments, the processor 182 may be a network-on-chip (NoC), a switch, or a trusted integrated circuit (TIC) that may be communicatively coupled or connected to various network-capable devices within the safety network 150 (i.e., via the radio module 185). The copy engine 190 may include a number of hardware-based stream-wise CRC engines in addition to firmware such as a memory-mapped subsystem for storing software-based ring descriptors for offloading CRC packet overhead from the hardware.

The radio module 185 may be configured for wireless communications, including implementing operations of various embodiments. The radio module 185 may exchange wireless signals via wireless communication link 122 with a base station 110 and via wireless communication link 124 with control units in other vehicles 152b. In some embodiments, the radio module 185 may also enable the vehicle 152a to communicate with a wireless communication device 120d (e.g., cellular phone) through a bidirectional wireless communication link 178, such as a WiFi or Bluetooth wireless data link. Similarly, the radio module 185 may enable the processor 182 to transmit and receive information to and from various network devices 189 within the safety network 150 via the wireless communication links 178. The network devices 189 may be any device capable of communicatively coupling to the radio module 185 within the safety network 150, such as a wireless charging station, a key fob or device for keyless entry, infotainment systems, cellular devices, tire pressure measurement systems, and satellite-based navigation systems (e.g., the Global Positioning System (GPS)). The provided examples of network devices 189 in communication with the radio module 185 is limited only for conciseness and is not intended to be exhaustive. In various embodiments, network devices under control may include also smart electrical plugs and smart switches, smart security systems, smart health devices and health monitors, smart appliances, smart electrical meters, smart toys, smart environmental monitors and environmental control systems, various Internet of Things devices, and any other suitable device(s) capable of communicating with the radio module 185.

In various embodiments, the wireless communication links 122, 124, 178 may implement any various known wireless communications protocols and standards, such as Radio Frequency for Consumer Electronics (RF4 CE), Controller Area Network (CAN), long range protocols such as 3GPP LTE, 3G, 4G, 5G (e.g., NR), GSM, CDMA, WCDMA, WiMAX, TDMA, any other mobile telephony communication technologies cellular RATs, medium range protocols such as Wi-Fi, LTE-U, LTE-Direct, LAA, MuL-TEfire, relatively short range RATs such as ZigBee, Bluetooth, BLE, DigRF, any other communications based on Institute of Electrical and Electronics engineers (IEEE) 802 standards (e.g., IEEE 802.3), infrared (IR) communications protocols such as RECS-80, RC-5, RC-6, NEC/Renesas protocol, or any other suitable IR communication protocol. In some embodiments, various network devices 189 may be connected directly to the safety subsystem 180 via a wired connection implementing one or more communication protocols such as ethernet, Recommended Standard (RS)-232, RS-485, Universal Asynchronous Receiver Transmitter (UART), Universal Synchronous/Asynchronous Receiver/Transmitter (USART), Universal Serial Bus (USB), High Definition Multimedia Interface (HDMI), or any other suitable wired communications protocol.

The safety subsystem 180 may be an Advanced Driver Assistance Systems (ADAS), and the wireless communication links 122, 124, 178, in conjunction with the safety subsystem 180 (e.g., processor 182, radio module 185, and copy engine 190, etc.) may further implement safety and/or standardized protocols as prescribed by AUTOSAR, including but not limited to Automotive Hardware Functional Safety (FuSa) Features (e.g., ISO 26262), any Consultative Committee for International Telegraphy and Telephony (CCITT), algorithms for serial streams (e.g., Wide Area Network (WAN), radio communication protocol, Secure Digital, DigRF, etc.), AUTOSAR CRC standards and recommended protocols such as AUTOSAR safety polynomial CRC32P4 with 0xF4ACFB13 polynomial, SAE J1850 CRC8 for 0x1D polynomial used for diagnostics and data sharing applications in vehicles, and 8-bit 0x2F CRC for open safety communication protocol.

The input module 183 may receive sensor data from one or more sensor components 188 as well as electronic signals from other components, including the drive control components 186 and the navigation components 187. The output module 184 may be used to communicate with or activate various components of the vehicle 152a, including the drive control components 186, the navigation components 187, and the sensor(s) 188.

The safety subsystem 180 may receive and transmit analog and/or digital sensor data from and to the sensor components 188, and may be configured to communicate with the sensor components 188 unilaterally and/or bidirectionally. The safety subsystem 180 in conjunction with the sensor components 188 may be in communication with network devices (e.g., wireless computing device 120, network devices 189) configured to relay sensor information of the network devices. The safety subsystem 180 in conjunction with the sensor components 188 may be configured to implement features such as electric vehicle (EV) wireless charging, keyless entry, phone-as-key, automated parking, tire pressure monitoring, remote sensor control, and automated driving features such as lane and brake checking and alerts.

The safety subsystem 180 may be coupled to the drive control components 186 to control physical elements of the vehicle 152a related to maneuvering and navigation of the vehicle, such as the engine, motors, throttles, steering elements, flight control elements, braking or deceleration elements, and the like.

The safety subsystem 180 may be coupled to the navigation components 187, and may receive data from the navigation components 187 and be configured to use such data to determine the present position and orientation of the vehicle 152a, as well as an appropriate course toward a destination.

The safety subsystem 180 may be coupled to the telematics components 191. The safety subsystem 180 may receive and transmit data from and to the telematics components 191, and may be configured to, in conjunction with the telematics components 191, transmit and receive information between base stations (e.g., 110) and other vehicles (e.g., 152b). The safety subsystem 180 in conjunction with the infotainment components 193 may be configured to provide features such as implementing Car2Car and Car2Infrastructure standards, LTE Offload, Media Services, over-the-air (OTA) updating, and general Internet access.

The safety subsystem 180 may be coupled to the infotainment components 193. The safety subsystem 180 may receive and transmit data from and to the infotainment components 193, and may be configured to stream data such as video and/or audio media to a display or media output unit of a communicatively connected network device (e.g., wireless computing device 120, network devices 189). The safety subsystem 180 in conjunction with the infotainment components 193 may be configured to provide features such as hands-free voice calling, music streaming, multimedia distribution, rear-seat entertainment systems, display sharing, Apple CarPlay, Android Auto, MirrorLink, and general Internet access.

The processor 182 and/or the navigation components 187 may be configured to communicate with a core network 140 (e.g., the Internet) using a wireless communication link 122 with a cellular data network base station 110. The processor 182 may also be configured to perform a variety of software application programs by executing processor-executable instructions in an application layer as described herein.

While the safety subsystem 180 is described as including separate components, in some embodiments some or all of the components (e.g., the processor 182, the memory 181, the input module 183, the output module 184, and the radio module 185) may be integrated in a single device or module, such as a system-on-a-chip (SoC) or system-in-package (SiP) processing device, such as described with reference to FIG. 2. Such an SoC or SiP processing device may be configured for use in vehicles and be configured, such as with processor-executable instructions executing in the processor 182, to perform operations of various embodiments when installed into a vehicle.

In some implementations, the safety network 150 may include one or more devices configured to communicate as part of an intelligent transportation system (ITS). ITS technologies may increase intercommunication and safety for driver-operated vehicles and autonomous vehicles. The cellular vehicle-to-everything (C-V2X) protocol defined by the 3rd Generation Partnership Project (3GPP) supports ITS technologies and serves as the foundation for vehicles to communicate directly with the communication devices around them. C-V2X defines transmission modes that provide non-line-of-sight awareness and a higher level of predictability for enhanced road safety and autonomous driving. Such C-V2X transmission modes may include V2V, V2I, and V2P, and may utilize frequencies in a 5.9 gigahertz (GHz) spectrum that is independent of a cellular network. C-V2X transmission modes may also include vehicle-to-network communications (V2N) in mobile broadband systems and technologies, such as 3G mobile communication technologies (e.g., GSM evolution (EDGE) systems, CDMA 2000 systems, etc.), 4G communication technologies (e.g., LTE, LTE-Advanced, WiMAX, etc.), as well as 5G systems.

Figure 1B:
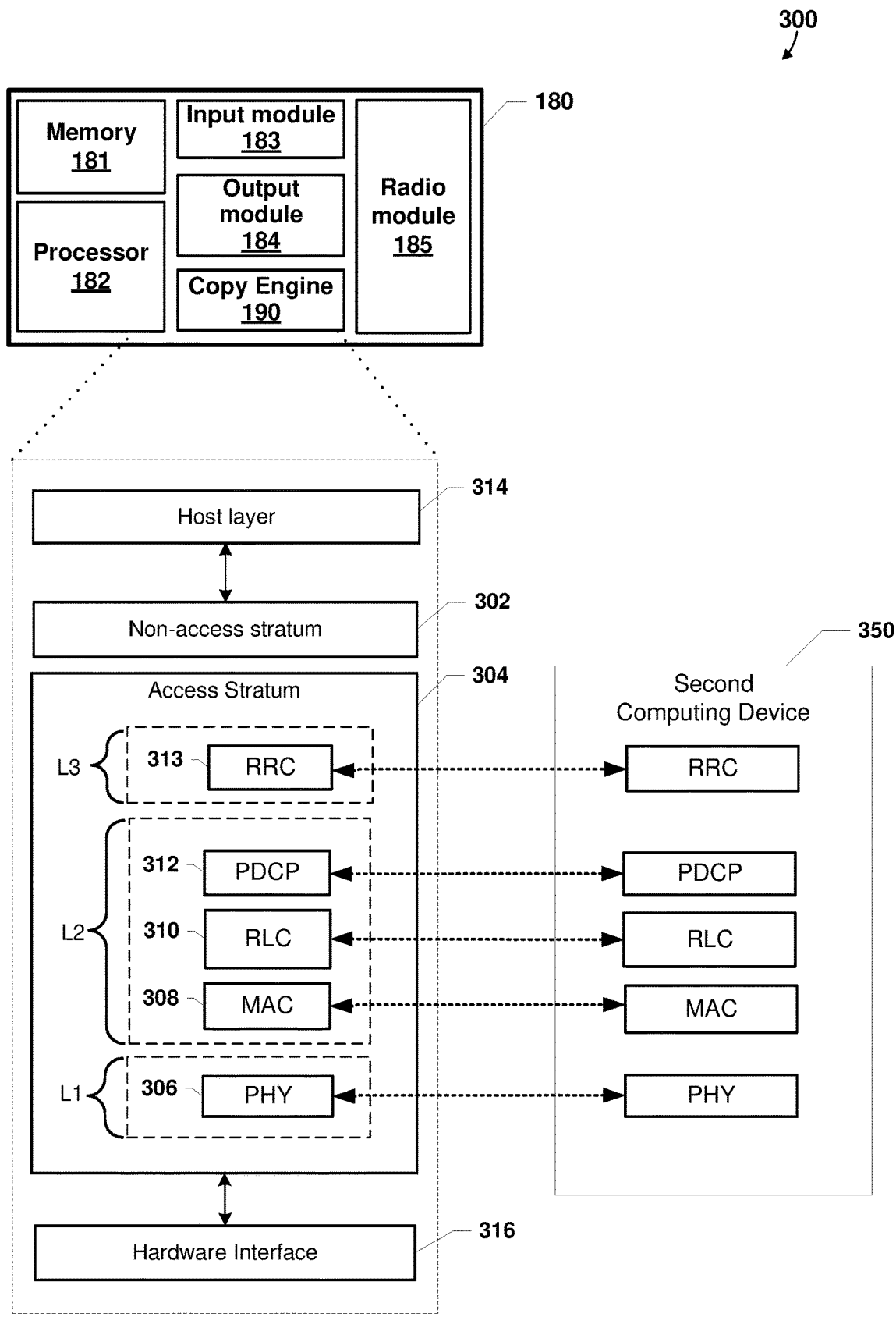
FIG. 1B is a diagram illustrating an example software architecture including a radio protocol stack for the user and control planes in wireless communications suitable for implementing embodiments.

FIG. 1B illustrates an example of a software architecture 300 including a radio protocol stack for the user and control planes in wireless communications between a safety subsystem 180 (e.g., a controller of the vehicle 152a, or SIP 200) and a second computing device 350 (e.g., in a vehicle 152b, network device(s) 189, wireless computing device 120). In some embodiments, the safety subsystem 180 and the second computing device 350 may communicate via D2D communication or another suitable device-to-device communication method. With reference to FIGS. 1A and 1B, the safety subsystem 180 may implement the software architecture 300 to communicate with the computing device 350. In various embodiments, layers in the software architecture 300 in the safety subsystem 180 may form logical connections with corresponding layers in software of the second computing device 350. The software architecture 300 may be distributed among one or more processors (e.g., the processors 212, 214, 216, 218, 252, 260).

While illustrated with respect to one radio protocol stack, in a multi-SIM (subscriber identity module) wireless computing device, the software architecture 300 may include multiple protocol stacks, each of which may be associated with a different SIM (e.g., two protocol stacks associated with two SIMs, respectively, in a dual-SIM wireless communication device). While described below with reference to LTE communication layers, the software architecture 300 may support any of variety of standards and protocols for wireless communications, and/or may include additional protocol stacks that support any of variety of standards and protocols wireless communications.

The software architecture 300 may include a Non-Access Stratum (NAS) 302 and an Access Stratum (AS) 304. The NAS 302 may include functions and protocols to support packet filtering, security management, mobility control, session management, and traffic and signaling between a SIM(s) of the wireless computing device (e.g., SIM(s) 204) and its core network 140. The AS 304 may include functions and protocols that support communication between a SIM(s) (e.g., SIM(s) 204) and entities of supported access networks (e.g., a base station). In particular, the AS 304 may include at least three layers (Layer 1, Layer 2, and Layer 3), each of which may contain various sub-layers.

In the user and control planes, Layer 1 (L1) of the AS 304 may be a physical layer (PHY) 306, which may oversee functions that enable transmission and/or reception over the air interface. Examples of such physical layer 306 functions may include cyclic redundancy check (CRC) attachment, coding blocks, scrambling and descrambling, modulation and demodulation, signal measurements, MIMO, etc. The physical layer may include various logical channels, including the Physical Downlink Control Channel (PDCCH) and the Physical Downlink Shared Channel (PDSCH).

In the user and control planes, Layer 2 (L2) of the AS 304 may be responsible for the link between the safety subsystem 180 and the second computing device 350 over the physical layer 306. In the various embodiments, Layer 2 may include a media access control (MAC) sublayer 308, a radio link control (RLC) sublayer 310, and a packet data convergence protocol (PDCP) 312 sublayer, each of which form logical connections terminating at the second computing device 350.

In the control plane, Layer 3 (L3) of the AS 304 may include a radio resource control (RRC) sublayer 3. While not shown, the software architecture 300 may include additional Layer 3 sublayers, as well as various upper layers above Layer 3. In various embodiments, the RRC sublayer 313 may provide functions including broadcasting system information, paging, and establishing and releasing an RRC signaling connection between the safety subsystem 180 and the second computing device 350. The direct communication messages from the applications layer may be transmitted either directly over L2 or L3, or via another signaling layer (e.g., PC5-signaling or PC5-S) over L2 or L3.

In various embodiments, the PDCP sublayer 312 may provide uplink functions including multiplexing between different radio bearers and logical channels, sequence number addition, handover data handling, integrity protection, ciphering, and header compression. In the downlink, the PDCP sublayer 312 may provide functions that include in-sequence delivery of data packets, duplicate data packet detection, integrity validation, deciphering, and header decompression.

In the uplink, the RLC sublayer 310 may provide segmentation and concatenation of upper layer data packets, retransmission of lost data packets, and Automatic Repeat Request (ARQ). In the downlink, while the RLC sublayer 310 functions may include reordering of data packets to compensate for out-of-order reception, reassembly of upper layer data packets, and ARQ.

In the uplink, MAC sublayer 308 may provide functions including multiplexing between logical and transport channels, random access procedure, logical channel priority, and hybrid-ARQ (HARQ) operations. In the downlink, the MAC layer functions may include channel mapping within a cell, de-multiplexing, discontinuous reception (DRX), and HARQ operations.

While the software architecture 300 may provide functions to transmit data through physical media, the software architecture 300 may further include at least one host layer 314 to provide data transfer services to various applications in the safety subsystem 180. In some embodiments, application-specific functions provided by the at least one host layer 314 may provide an interface between the software architecture and the general-purpose processor 206.

In other embodiments, the software architecture 300 may include one or more higher logical layer (e.g., transport, session, presentation, application, etc.) that provide host layer functions. For example, in some embodiments, the software architecture 300 may include a network layer (e.g., IP layer) in which a logical connection terminates at a packet data network (PDN) gateway (PGW). In some embodiments, the software architecture 300 may include an application layer in which a logical connection terminates at another device (e.g., end user device, server, etc.). In some embodiments, the software architecture 300 may further include in the AS 304 a hardware interface 316 between the physical layer 306 and the communication hardware (e.g., one or more radio frequency transceivers).

Figure 1C:
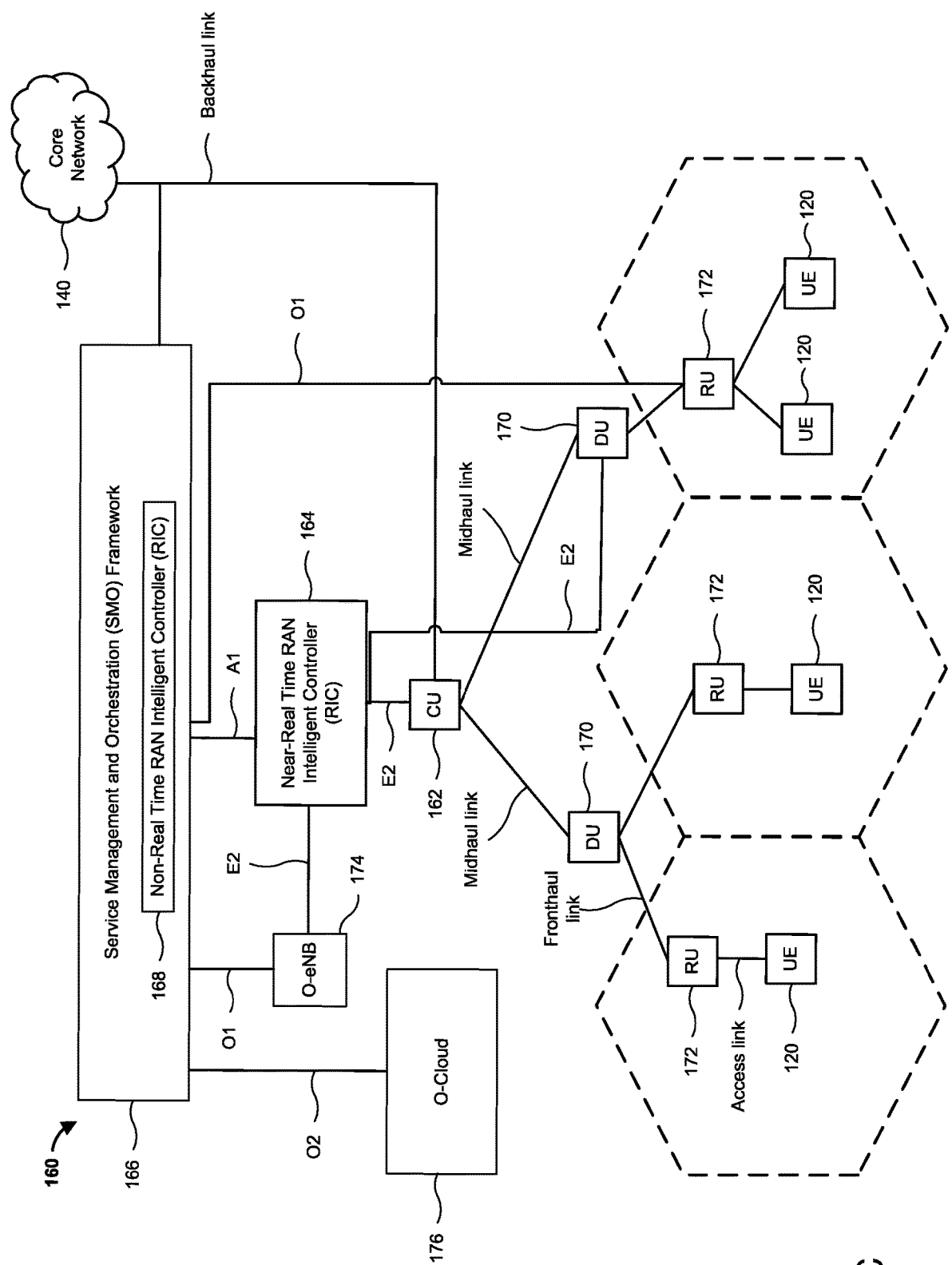
FIG. 1C is a system block diagram illustrating an example disaggregated base station architecture that may be part of a 5G network suitable for implementing a hardware-based dynamic CRC generator according to various embodiments.

FIG. 1C is a system block diagram illustrating an example disaggregated base station 160 architecture that may be part of a 5G network that may support external communications with a network implementing various embodiments and thus interface with a hardware-based dynamic CRC generator. With reference to FIGS. 1A-1C, the disaggregated base station 160 architecture may include one or more central units (CUs) 162 that can communicate directly with a core network 140 via a backhaul link, or indirectly with the core network 140 through one or more disaggregated base station units, such as a Near-Real Time (Near-RT) RAN Intelligent Controller (RIC) 164 via an E2 link, or a Non-Real Time (Non-RT) RIC 168 associated with a Service Management and Orchestration (SMO) Framework 166, or both. A CU 162 may communicate with one or more distributed units (DUs) 170 via respective midhaul links, such as an F1 interface. The DUs 170 may communicate with one or more radio units (RUs) 172 via respective fronthaul links. The RUs 172 may communicate with respective UEs 120 via one or more radio frequency (RF) access links. In some implementations, user equipment (UE), such as a vehicle autonomous driving system (ADS) 104, may be simultaneously served by multiple RUs 172.

Each of the units (i.e., CUs 162, DUs 170, RUs 172), as well as the Near-RT RICs 164, the Non-RT RICs 168 and the SMO Framework 166, may include one or more interfaces or be coupled to one or more interfaces configured to receive or transmit signals, data, or information (collectively, signals) via a wired or wireless transmission medium. Each of the units, or an associated processor or controller providing instructions to the communication interfaces of the units, can be configured to communicate with one or more of the other units via the transmission medium. For example, the units can include a wired interface configured to receive or transmit signals over a wired transmission medium to one or more of the other units. Additionally, the units can include a wireless interface, which may include a receiver, a transmitter or transceiver (such as a radio frequency (RF) transceiver), configured to receive or transmit signals, or both, over a wireless transmission medium to one or more of the other units.

In some aspects, the CU 162 may host one or more higher layer control functions. Such control functions may include the radio resource control (RRC), packet data convergence protocol (PDCP), service data adaptation protocol (SDAP), or the like. Each control function may be implemented with an interface configured to communicate signals with other control functions hosted by the CU 162. The CU 162 may be configured to handle user plane functionality (i.e., Central Unit-User Plane (CU-UP)), control plane functionality (i.e., Central Unit-Control Plane (CU-CP)), or a combination thereof. In some implementations, the CU 162 can be logically split into one or more CU-UP units and one or more CU-CP units. The CU-UP unit can communicate bidirectionally with the CU-CP unit via an interface, such as the E1 interface when implemented in an O-RAN configuration. The CU 162 can be implemented to communicate with DUs 170, as necessary, for network control and signaling.

The DU 170 may correspond to a logical unit that includes one or more base station functions to control the operation of one or more RUs 172. In some aspects, the DU 170 may host one or more of a radio link control (RLC) layer, a medium access control (MAC) layer, and one or more high physical (PHY) layers (such as modules for forward error correction (FEC) encoding and decoding, scrambling, modulation and demodulation, or the like) depending, at least in part, on a functional split, such as those defined by the 3rd Generation Partnership Project (3GPP). In some aspects, the DU 170 may further host one or more low PHY layers. Each layer (or module) may be implemented with an interface configured to communicate signals with other layers (and modules) hosted by the DU 170, or with the control functions hosted by the CU 162.

Lower-layer functionality may be implemented by one or more RUs 172. In some deployments, an RU 172, controlled by a DU 170, may correspond to a logical node that hosts RF processing functions, or low-PHY layer functions (such as performing fast Fourier transform (FFT), inverse FFT (iFFT), digital beamforming, physical random-access channel (PRACH) extraction and filtering, or the like), or both, based at least in part on the functional split, such as a lower layer functional split. In such an architecture, the RU(s) 172 may be implemented to handle over the air (OTA) communication with one or more UEs 120. In some implementations, real-time and non-real-time aspects of control and user plane communication with the RU(s) 172 may be controlled by the corresponding DU 170. In some scenarios, this configuration may enable the DU(s) 170 and the CU 162 to be implemented in a cloud-based radio access network (RAN) architecture, such as a vRAN architecture.

The SMO Framework 166 may be configured to support RAN deployment and provisioning of non-virtualized and virtualized network elements. For non-virtualized network elements, the SMO Framework 166 may be configured to support the deployment of dedicated physical resources for RAN coverage requirements, which may be managed via an operations and maintenance interface (such as an O1 interface). For virtualized network elements, the SMO Framework 166 may be configured to interact with a cloud computing platform (such as an open cloud (O-Cloud) 176) to perform network element life cycle management (such as to instantiate virtualized network elements) via a cloud computing platform interface (such as an O2 interface). Such virtualized network elements can include, but are not limited to, CUs 162, DUs 170, RUs 172 and Near-RT RICs 164. In some implementations, the SMO Framework 166 may communicate with a hardware aspect of a 4G RAN, such as an open eNB (O-eNB) 174, via an O1 interface. Additionally, in some implementations, the SMO Framework 166 may communicate directly with one or more RUs 172 via an O1 interface. The SMO Framework 166 also may include a Non-RT RIC 168 configured to support functionality of the SMO Framework 166.

The Non-RT RIC 168 may be configured to include a logical function that enables non-real-time control and optimization of RAN elements and resources, Artificial Intelligence/Machine Learning (AI/ML) workflows including model training and updates, or policy-based guidance of applications/features in the Near-RT RIC 164. The Non-RT RIC 168 may be coupled to or communicate with (such as via an A1 interface) the Near-RT RIC 164. The Near-RT RIC 164 may be configured to include a logical function that enables near-real-time control and optimization of RAN elements and resources via data collection and actions over an interface (such as via an E2 interface) connecting one or more CUs 162, one or more DUs 170, or both, as well as an O-eNB, with the Near-RT RIC 164.

In some implementations, to generate AI/ML models to be deployed in the Near-RT RIC 164, the Non-RT RIC 168 may receive parameters or external enrichment information from external servers. Such information may be utilized by the Near-RT RIC 164 and may be received at the SMO Framework 166 or the Non-RT RIC 168 from non-network data sources or from network functions. In some examples, the Non-RT RIC 168 or the Near-RT RIC 164 may be configured to tune RAN behavior or performance. For example, the Non-RT RIC 168 may monitor long-term trends and patterns for performance and employ AI/ML models to perform corrective actions through the SMO Framework 166 (such as reconfiguration via O1) or via creation of RAN management policies (such as A1 policies).

Various embodiments may be implemented on a number of single processor and multiprocessor computer systems, including a system-on-a-chip (SoC) or system-in-a-package (SiP). FIG. 2 is a component block diagram illustrating an example computing and wireless modem system 200 suitable for implementing any of the various embodiments. Various embodiments may be implemented on a number of single processor and multiprocessor computer systems, including an SoC or SiP.

Figure 2:
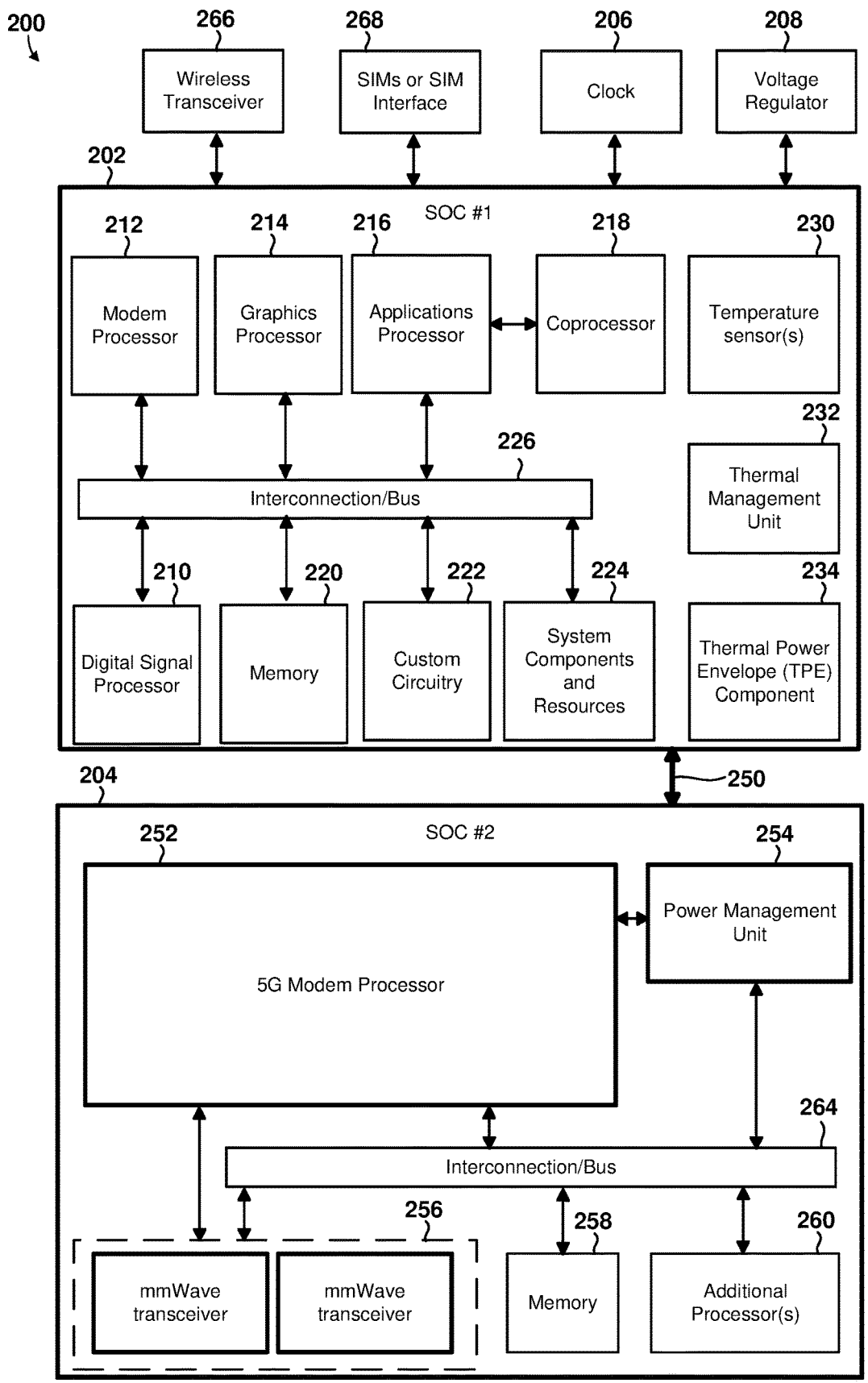
FIG. 2 is a component block diagram illustrating an example computing and wireless modem system suitable for implementing various embodiments.

With reference to FIGS. 1A-2, the illustrated example wireless device 200 (which may be a system-in-a-package in some embodiments) includes a two SoCs 202, 204 coupled to a clock 206, a voltage regulator 208, at least one subscriber identity module (SIM) 268 and/or a SIM interface and a wireless transceiver 266 configured to send and receive wireless communications via an antenna (not shown) to/from network wireless devices, such as the base station 110, wireless computing device 120, vehicle 152b, and network devices 189. In some embodiments, the first SoC 202 operate as central processing unit (CPU) of the wireless device that carries out the instructions of software application programs by performing the arithmetic, logical, control and input/output (I/O) operations specified by the instructions. In some embodiments, the second SoC 204 may operate as a specialized processing unit. For example, the second SoC 204 may operate as a specialized 5G processing unit responsible for managing high volume, high speed (e.g., 5 Gbps, etc.), and/or very high frequency short wave length (e.g., 28 GHz mmWave spectrum, etc.) communications.

The first SoC 202 may include a digital signal processor (DSP) 210, a modem processor 212, a graphics processor 214, an application processor (AP) 216, one or more coprocessors 218 (e.g., vector co-processor) connected to one or more of the processors, memory 220, custom circuitry 222, system components and resources 224, an interconnection/bus module 226, one or more temperature sensors 230, a thermal management unit 232, and a thermal power envelope (TPE) component 234. The second SoC 204 may include a 5G modem processor 252, a power management unit 254, an interconnection/bus module 264, the plurality of mmWave transceivers 256, memory 258, and various additional processors 260, such as an applications processor, packet processor, etc.

Each processor 210, 212, 214, 216, 218, 252, 260 may include one or more cores, and each processor/core may perform operations independent of the other processors/cores. For example, the first SoC 202 may include a processor that executes a first type of operating system (e.g., FreeBSD, LINUX, OS X, etc.) and a processor that executes a second type of operating system (e.g., MICROSOFT WINDOWS 10). In addition, any or all of the processors 210, 212, 214, 216, 218, 252, 260 may be included as part of a processor cluster architecture (e.g., a synchronous processor cluster architecture, an asynchronous or heterogeneous processor cluster architecture, etc.).

The first and second SoC 202, 204 may include various system components, resources and custom circuitry for managing sensor data, analog-to-digital conversions, wireless data transmissions, and for performing other specialized operations, such as decoding data packets and processing encoded audio and video signals for rendering in a web browser. For example, the system components and resources 224 of the first SoC 202 may include power amplifiers, voltage regulators, oscillators, phase-locked loops, peripheral bridges, data controllers, memory controllers, system controllers, access ports, timers, and other similar components used to support the processors and software clients running on a wireless device. The system components and resources 224 and/or custom circuitry 222 may also include circuitry to interface with peripheral devices, such as cameras, electronic displays, wireless communication devices, external memory chips, etc.

The first and second SoC 202, 204 may communicate via interconnection/bus module 250. The various processors 210, 212, 214, 216, 218, may be interconnected to one or more memory elements 220, system components and resources 224, and custom circuitry 222, and a thermal management unit 232 via an interconnection/bus module 226. Similarly, the processor 252 may be interconnected to the power management unit 254, the mmWave transceivers 256, memory 258, and various additional processors 260 via the interconnection/bus module 264. The interconnection/bus module 226, 250, 264 may include an array of reconfigurable logic gates and/or implement a bus architecture (e.g., CoreConnect, AMBA, etc.). Communications may be provided by advanced interconnects, such as high-performance networks-on chip (NoCs).

The first and/or second SoCs 202, 204 may further include an input/output module (not illustrated) for communicating with resources external to the SoC, such as a clock 206, a voltage regulator 208, one or more wireless transceivers 266, and at least one SIM 268 and/or SIM interface (i.e., an interface for receiving one or more SIM cards). Resources external to the SoC (e.g., clock 206, voltage regulator 208) may be shared by two or more of the internal SoC processors/cores. The at least one SIM 268 (or one or more SIM cards coupled to one or more SIM interfaces) may store information supporting multiple subscriptions, including a first SGNR subscription and a second SGNR subscription, etc.

In addition to the example system-in-a-package 200 discussed above, various embodiments may be implemented in a wide variety of computing systems, which may include a single processor, multiple processors, multicore processors containing two or more independent processing cores (e.g., central processing unit (CPU) core, Internet protocol (IP) core, graphics processor unit (GPU) core, etc.), or any combination thereof.

Figure 3:
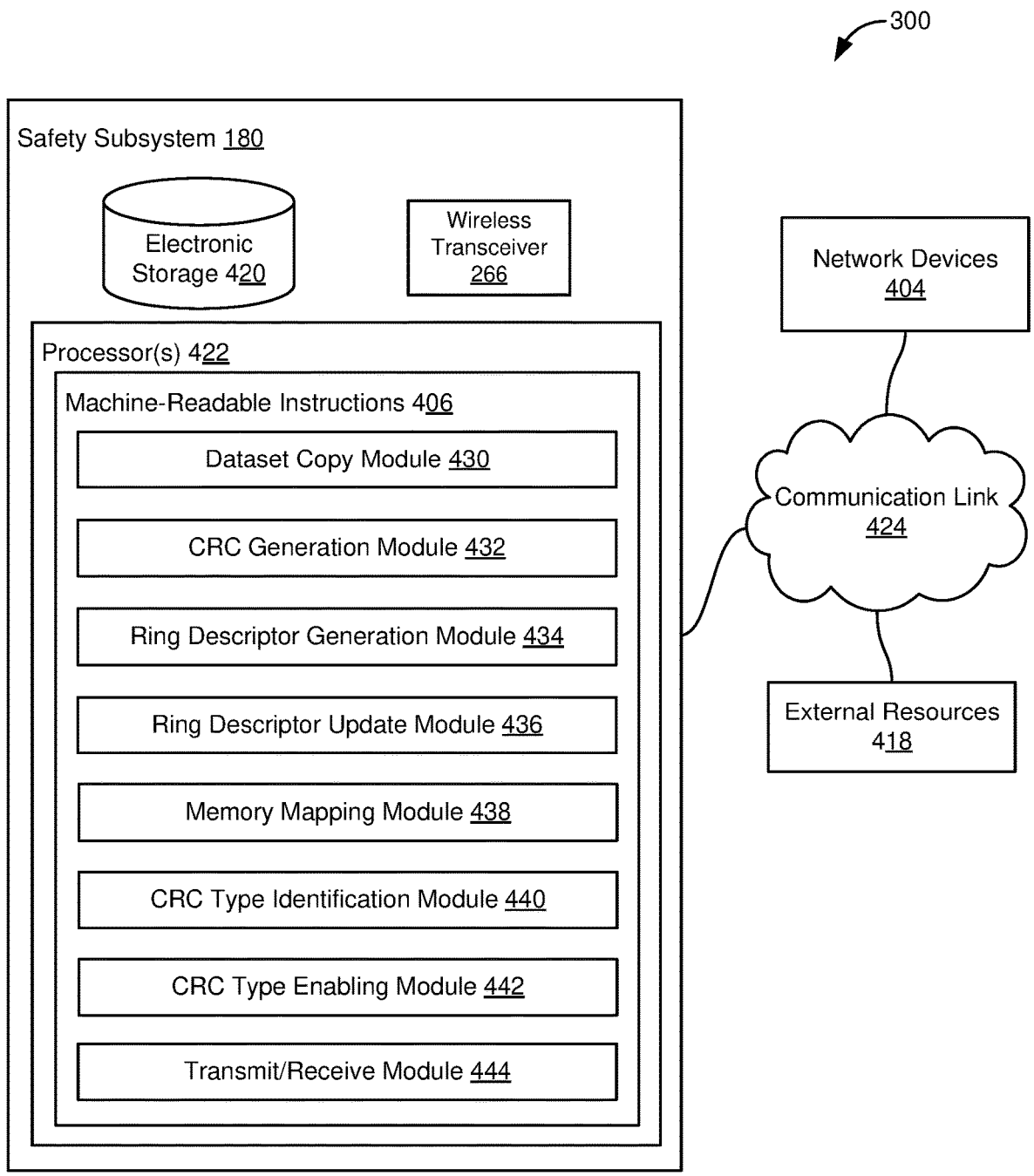
FIG. 3 is a component block diagram illustrating an example system 300 configured to establish secure device-to-device communications between a safety subsystem and network devices according to some embodiments.

FIG. 3 is a component block diagram illustrating an example system 300 configured to establish secure device-to-device communications between a safety subsystem and network devices according to some embodiments. With reference to FIGS. 1A-3, the system 300 may include the safety subsystem 180, one or more network device(s) 404 (e.g., vehicle 152b, wireless computing device 120, network devise 189, second computing device 350) and external resources 418 (e.g., databases, network servers), which may communicate via a wireless communication network 424. External resources 418 may include sources of information outside of the system 300, external entities participating with the system 300, or other resources. In some implementations, some or all of the functionality attributed herein to external resources 418 may be provided by resources included in the system 300. The system 300 may include a plurality of hardware, software, and/or firmware components operating together to provide the functionality attributed herein to the processor(s) 422.

The safety subsystem 180 may include electronic storage 420 that may be configured to store information related to functions implemented by a dataset copy module 430, a CRC generation module 432, a ring descriptor generator module 434, a ring descriptor update module 436, a memory mapping module 438, a CRC type identification module 440, a CRC type enabling module 442, a transmit/receive module 444, and any other instruction modules.

The electronic storage 420 may include non-transitory storage media that electronically stores information. The electronic storage 420 may include one or both of system storage that is provided integrally (i.e., substantially non-removable) with the system 200 and/or removable storage that is removably connectable to the system 200 via, for example, a port (e.g., a universal serial bus (USB) port, a firewire port, etc.) or a drive (e.g., a disk drive, etc.). In various embodiments, electronic storage 420 may include one or more of electrical charge-based storage media (e.g., EEPROM, RAM, etc.), solid-state storage media (e.g., flash drive, etc.), optically readable storage media (e.g., optical disks, etc.), magnetically readable storage media (e.g., magnetic tape, magnetic hard drive, floppy drive, etc.), and/or other electronically readable storage media. The electronic storage 420 may include one or more virtual storage resources (e.g., cloud storage, a virtual private network, and/or other virtual storage resources). The electronic storage 420 may store software algorithms, information determined by processor(s) 422, and/or other information that enables the system 200 to function as described herein.

The safety subsystem 180 may be configured by machine-readable instructions 406. Machine-readable instructions 406 may include one or more instruction modules. The instruction modules may include computer program modules. The instruction modules may include one or more of the dataset copy module 430, the CRC generation module 432, the ring descriptor generator module 434, the ring descriptor update module 436, the memory mapping module 438, the CRC type identification module 440, the CRC type enabling module 442, the transmit/receive module 444, and other instruction modules (not illustrated). The safety subsystem 180 may include processor(s) 422 configured to implement the machine-readable instructions 406 and corresponding modules.

The processor(s) 422 may include one of more local processors that may be configured to provide information processing capabilities in the system 200. As such, the processor(s) 422 may include one or more of a digital processor, an analog processor, a digital circuit designed to process information, an analog circuit designed to process information, a state machine, and/or other mechanisms for electronically processing information. Although the processor(s) 422 is shown in FIG. 3 as a single entity, this is for illustrative purposes only. In some embodiments, the processor(s) 422 may include a plurality of processing units. These processing units may be physically located within the same device, or the processor(s) 422 may represent processing functionality of a plurality of devices distributed in the system 200.

In some embodiments, the processor(s) 422 executing the dataset copy module 430 may be configured to copy, in hardware of the copy engine, a first dataset received from an interface bus to obtain a first dataset copy. In some embodiments, the processor(s) 422 executing the dataset copy module 430 may be configured to copy, in hardware of the copy engine, a second dataset received from the interface bus to obtain a second dataset copy. In some embodiments, the processor(s) 422 executing the dataset copy module 430 may be configured to copy, in hardware of the copy engine, the first dataset based on the first source data pointer. In some embodiments, the processor(s) 422 executing the dataset copy module 430 may be configured to copy the second dataset based on the second source data pointer. In some embodiments, the processor(s) 422 executing the dataset copy module 430 may be configured to copy, in hardware of the copy engine, a third dataset received from the interface bus to obtain a third dataset copy.

In some embodiments, the processor(s) 422 executing the CRC generation module 432 may be configured to generate, via a first stream-wise CRC engine in the hardware of the copy engine, a first CRC value for the first dataset copy and, in parallel generate, via a second stream-wise CRC engine in the hardware of the copy engine, a second CRC value for the second dataset copy. In some embodiments, the processor(s) 422 executing the CRC generation module 432 may be configured to generate, via the first stream-wise CRC engine, the first CRC value for the first dataset copy based on a first CRC type indicating a first communication protocol. In some embodiments, the processor(s) 422 executing the CRC generation module 432 may be configured to generate, via the second stream-wise CRC engine, the second CRC value for the second dataset copy based on a second CRC type indicating a second communication protocol. In some embodiments, the processor(s) 422 executing the CRC generation module 432 may be configured to generating, via the first stream-wise CRC engine, a final CRC value, in which the final CRC value is generated using the third dataset copy and the first CRC value.

In some embodiments, the processor(s) 422 executing the ring descriptor generator module 434 may be configured to generate, based on a first communication message, a first source ring descriptor including a first source data pointer indicating a memory location of the first dataset. In some embodiments, the processor(s) 422 executing the ring descriptor generator module 434 may be configured to generate, based on a second communication message, a second source ring descriptor including a second source data pointer indicating a memory location of the second dataset. In some embodiments, the processor(s) 422 executing the ring descriptor generator module 434 may be configured to generate a first status ring descriptor including the first CRC value and a first status bit. In some embodiments, the processor(s) 422 executing the ring descriptor generator module 434 may be configured to generate a second status ring descriptor including the second CRC value and a second status bit. In some embodiments, the processor(s) 422 executing the ring descriptor generator module 434 may be configured to generate a first destination ring descriptor including a first destination data pointer. In some embodiments, the processor(s) 422 executing the ring descriptor generator module 434 may be configured to generate a second destination ring descriptor including a second destination data pointer.

In some embodiments, the processor(s) 422 executing the ring descriptor update module 436 may be configured to update a source ring descriptor, a status ring descriptor, and a destination ring descriptor, including updating length bits, gather bits, source data pointers, CRC values, and destination data pointers. In some embodiments, the processor(s) 422 executing the ring descriptor update module 436 may be configured to set the first status bit after generating the first CRC value, in which transmitting the first stream-wise CRC message is performed in response to setting the first status bit. In some embodiments, the processor(s) 422 executing the ring descriptor update module 436 may be configured to set the second status bit after generating the second CRC value, in which transmitting the second stream-wise CRC message is performed in response to setting the second status bit.

In some embodiments, the processor(s) 422 executing the memory mapping module 438 may be configured to allocate a range of memory locations and addresses with an external memory or a memory subsystem embedded within a copy engine (e.g., firmware, DDR) for storing data structures such as ring descriptors and associated data including metadata.

In some embodiments, the processor(s) 422 executing the CRC type identification module 440 may be configured to identify a CRC type associated with a CRC algorithm defined by a communication standard or protocol, in which the CRC type is identifiable in metadata received as part of a communication from a network device external from the copy engine.

In some embodiments, the processor(s) 422 executing the CRC type enabling module 442 may be configured to enable and control hardware circuitry within a stream-wise CRC engine of the copy engine generate a CRC value for a dataset based on a CRC type associated with the dataset.

In some embodiments, the processor(s) 422 executing the transmit/receive module 444 may be configured to transmit, to a processor of the computing device, a first stream-wise CRC message including the first dataset copy and the first CRC value. In some embodiments, the processor(s) 422 executing the transmit/receive module 444 may be configured to transmit, to the processor, a second stream-wise CRC message including the second dataset copy and the second CRC value. In some embodiments, the processor(s) 422 executing the transmit/receive module 444 may be configured to transmitting the first stream-wise CRC message based on the first destination data pointer. In some embodiments, the processor(s) 422 executing the transmit/receive module 444 may be configured to transmit the second stream-wise CRC message based on the second destination data pointer. In some embodiments, the processor(s) 422 executing the transmit/receive module 444 may be configured to transmit, to the processor, the first stream-wise CRC message including the first dataset copy, the third dataset copy, and the final CRC value.

The processor(s) 422 may execute the modules 430-444 and/or other modules by software, hardware, firmware, some combination of software, hardware, and/or firmware, and/or other mechanisms for configuring processing capabilities on processor(s) 422.

The description of the functionality provided by the different modules 430-444 is for illustrative purposes, and is not intended to be limiting, as any of modules 430-444 may provide more or less functionality than is described. For example, one or more of modules 430-444 may be eliminated, and some or all of its functionality may be provided by other ones of modules 430-444. As another example, processor(s) 422 may execute one or more additional modules that may perform some or all of the functionality attributed below to one of modules 430-444.

Figure 4:
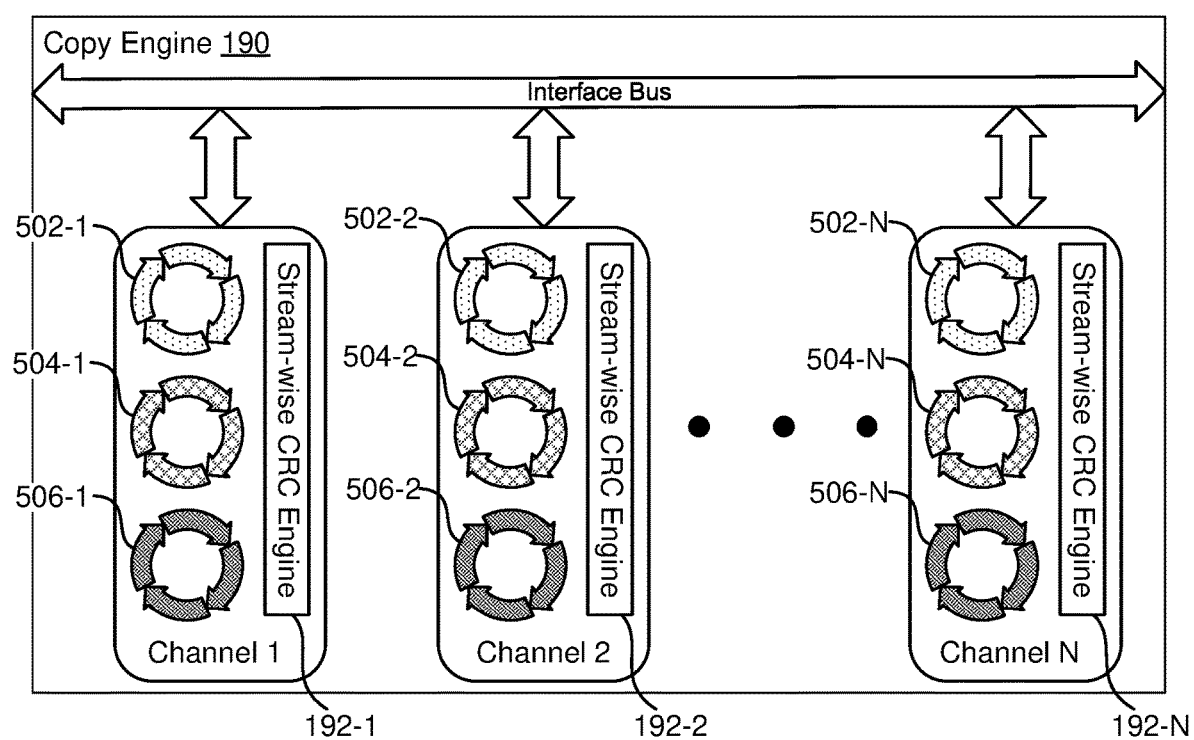
FIG. 4 is a block diagram of a copy engine including stream-wise CRC engines according to various embodiments.

FIG. 4 is a block diagram of a copy engine including stream-wise CRC engines according to various embodiments. With reference to FIGS. 1A-4, the copy engine 190 may include any number "N" hardware-based stream-wise CRC engines 192. For example, the copy engine 190 may include a first stream-wise CRC engine 192-1, a second stream-wise CRC engine 192-2, an "Nth" stream-wise CRC engine 192-N, and any number of stream-wise CRC engines (not illustrated) between the second stream-wise CRC engine 192-2 and the Nth stream-wise CRC engine 192-N.

The copy engine 190 may be a module in a safety subsystem (e.g., 180) that copies datasets during data transfer (i.e., receiving and transmitting) for all types of communication protocols including Ethernet, CAN, serial transfer, SD, DDR, BLE, among others. An interface bus (e.g., advanced eXtensible interface (AXI), interconnection/bus module 226, 264) may connect the stream-wise CRC engines 192 of the copy engine 190 to a processor (e.g., 164) within the safety subsystem.

The copy engine 190 may calculate or otherwise generate CRC in a packet-wise manner (i.e., conventional CRC calculations), in a stream-wise manner in parallel channels, and/or according to each CRC standard defined within communication protocols implemented within the safety network (e.g., 150). Specifically, the stream-wise CRC engines 192 may each be associated with a separate channel in which software-based ring descriptors indicate a source, status, and destination corresponding to a dataset that is being processed by a stream-wise CRC engine 192 for error checking purposes. In other words, CRC calculations may be performed by the stream-wise CRC engines 192 (i.e., in the hardware) after software generates and stores the source, status, and destination ring descriptors that identify a corresponding dataset. For example, the copy engine 190 may partition, generate, or otherwise define separate channels in a memory-mapped area (i.e., within a memory-mapped subsystem (e.g., within the copy engine 190; within DDR connected to or embedded within the copy engine 190; within firmware of the copy engine 190)) for each stream-wise CRC engine 192. As illustrated, there may be N number of channels equal to the N number of stream-wise CRC engines 192: Channel 1 may include the stream-wise CRC engine 192-1, a source ring descriptor 502-1, a status ring descriptor 504-1, and a destination ring descriptor 506-1; Channel 2 may include the stream-wise CRC engine 192-2, a source ring descriptor 502-2, a status ring descriptor 504-2, and a destination ring descriptor 506-2; Channel N may include the stream-wise CRC engine 192-N, a source ring descriptor 502-N, a status ring descriptor 504-N, and a destination ring descriptor 506-N; and any other channels may include the equivalent ring descriptors. Thus, each of the ring descriptors 502, 504, 506 may be data structures that are stored in firmware (i.e., a memory-mapped subsystem) or in a memory-mapped area of the copy engine 190.

Each channel N may process multiple CRC types, or various CRC algorithms defined by wireless communication protocols and standards (e.g., AUTOSAR, WiFi, BLE, DigRF, etc.) Implementing separate channels N with each channel including a hardware-based stream-wise CRC engine 192 may allow a for parallel handling and calculation of multiple CRC types for various applications. For example, Channel 1 may process a stream, or stack of datasets, for CRC checksum verification, in which each dataset within the stack of datasets may be a same or different CRC type, at the same time that Channel 2 is processing a different stack of datasets. In some embodiments, the order of calculating the CRC for each dataset within a channel may be based on order of arrival (i.e., when a stream-wise CRC engine 192 copies a dataset). In some embodiments, the order of calculating the CRC for each dataset within a channel may be based on priority (e.g., high priority DMA, low priority DMA, dynamic priority, fixed priority).

Figure 5:
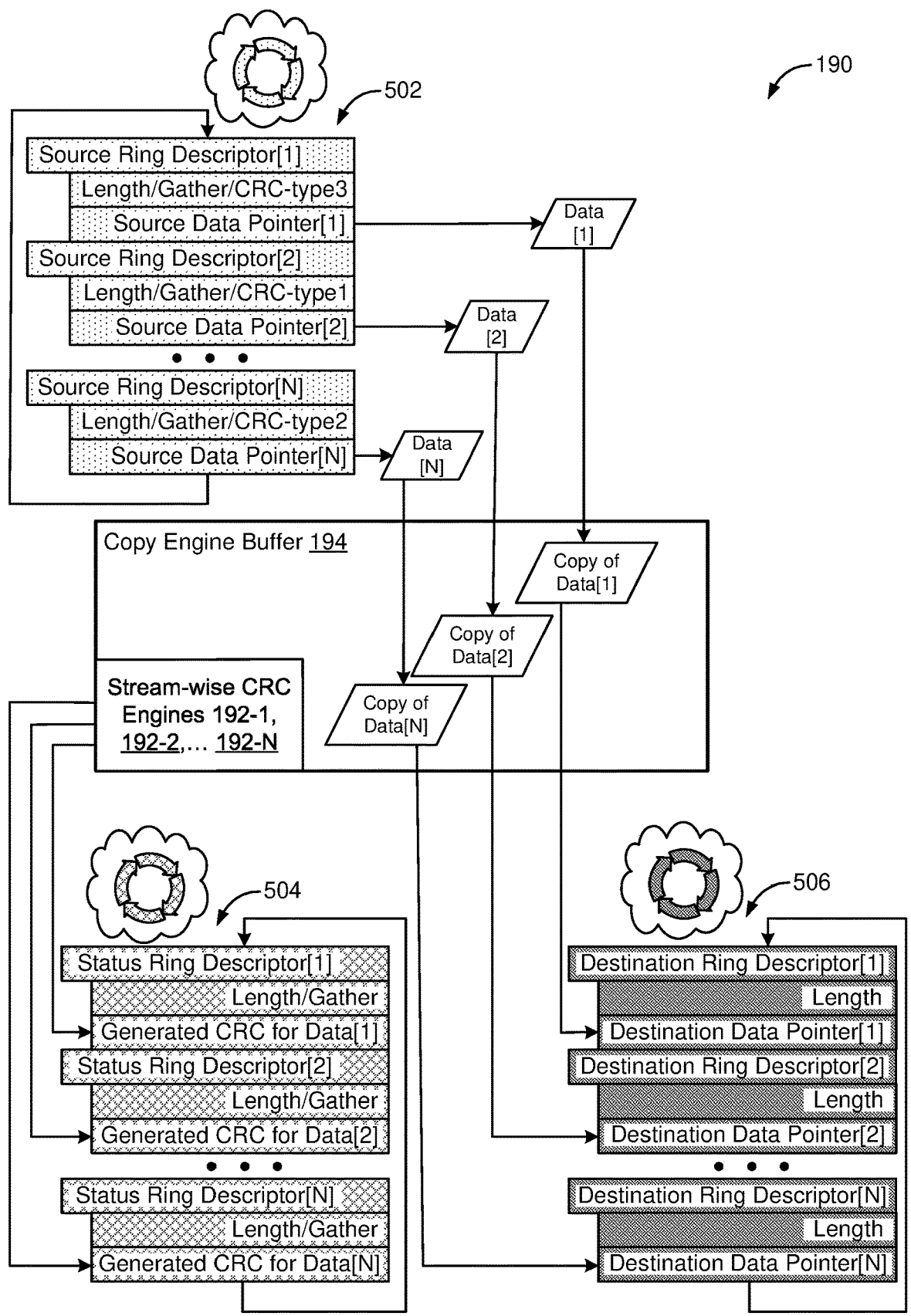
FIG. 5 is a block diagram of a copy engine including software-based ring descriptors according to various embodiments.

FIG. 5 is a block diagram of a copy engine including software-based ring descriptors according to various embodiments. With reference to FIGS. 1A-5, the copy engine 190 may generate and store, in a memory-mapped area in firmware of the copy engine 190, source ring descriptors 502, status ring descriptors 504, and destination ring descriptors 506.

Each ring descriptor may be stored in stacks of the same type of ring descriptor according to the order in which a dataset is received (i.e., from a communicatively connected device (e.g., network devices 189, wireless computing device 120, vehicle 152b) via the radio module 185). For example, each dataset may be associated with a source ring descriptor 502, a status ring descriptor 504, and a destination ring descriptor 506.

Figure 6:
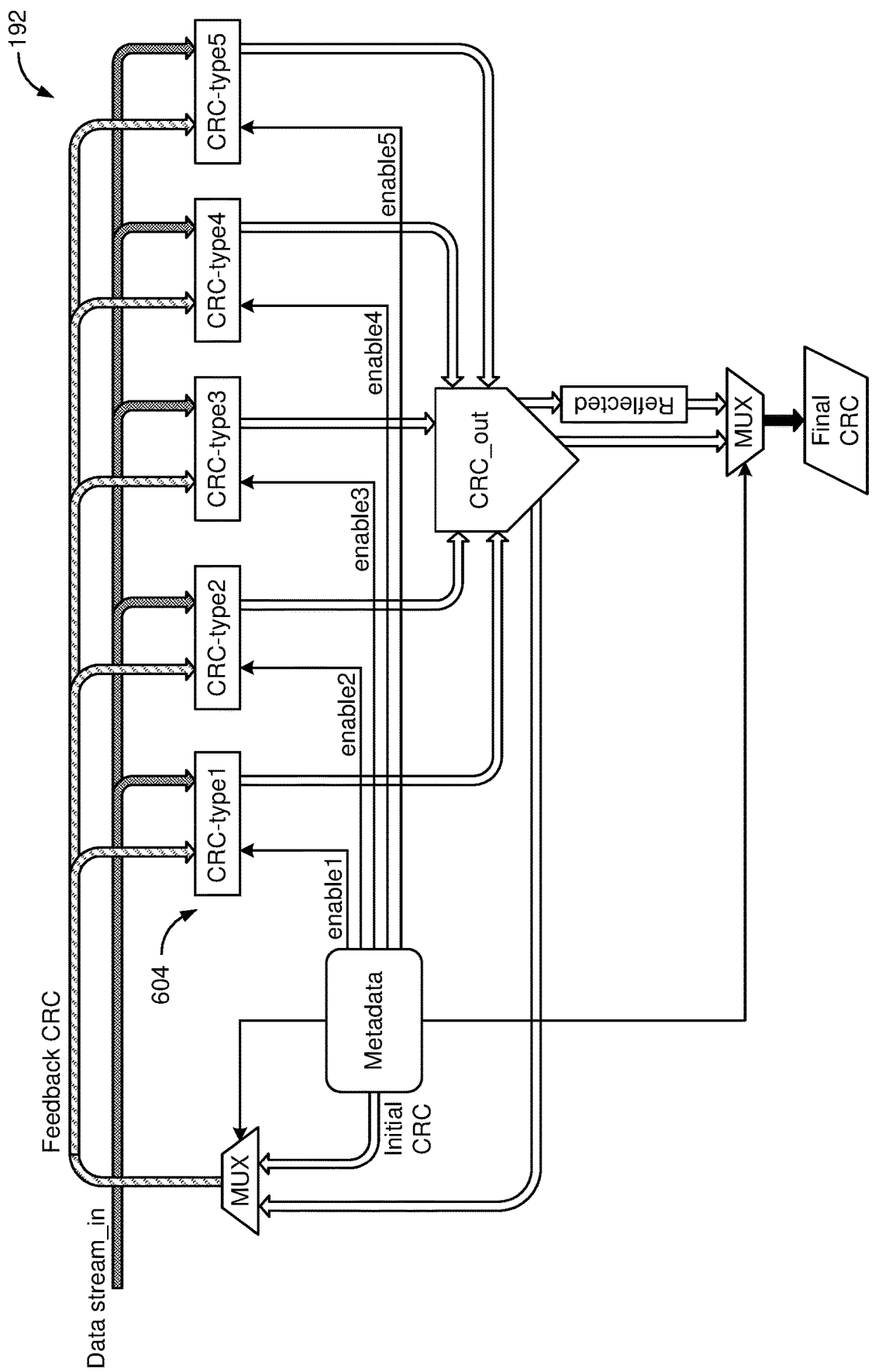
FIG. 6 is block diagram of a stream-wise CRC engine implemented within a channel of a copy engine according to various embodiments.

The copy engine 190 may generate, based on metadata included in each dataset, a source ring descriptor 502, a status ring descriptor 504, and a destination ring descriptor 506 associated with each received dataset. The copy engine 190 may store, in firmware, each ring descriptor for all datasets together according to ring descriptor type. For example, the source ring descriptors 502 (e.g., source ring descriptor[1], [2], [N]) of all datasets (e.g., Data [1], [2], [N]) may be stored together in firmware as a sequential stack, the status ring descriptors 504 (e.g., status ring descriptor[1], [2], [N]) of all datasets may be stored together in firmware as a separate sequential stack, and the destination ring descriptors 506 (e.g., destination ring descriptor[1], [2], [N]) of all datasets (e.g., Data [1], [2], [N]) may be stored together in firmware as another sequential stack. Thus, as illustrated in FIGS. 5 and 6, the source ring descriptors 502-1, 502-2, . . . 502-N in each separate channel (e.g., Channel 1, 2, . . . N) may be aggregated and stored as a single stack in firmware of the copy engine 190, the status ring descriptors 504-1, 504-2, . . . 504-N in each separate channel may be aggregated and stored as a single stack, and the destination ring descriptors 506-1, 506-2, . . . 506-N in each separate channel may be aggregated and stored as a single stack. Each ring descriptor stack may be ordered sequentially according to the order in which the copy engine receiving and/or copied each dataset within the copy engine buffer 194.

The copy engine 190 may receive, or otherwise be notified and request, one or more datasets regarding communications between the safety subsystem 180 and any network devices within the safety network 150. The copy engine 190 may copy, within a hardware-based copy engine buffer 194, any received datasets. For example, the copy engine 190 may receive and copy any number of datasets (e.g., Data [1], Data [2], . . . Data [N]) from one or more devices according to one or more communications protocols, in which each communication protocol requires various CRC verification processes and algorithms. The datasets received from each network device may include metadata that the copy engine 190 may use to generate the various ring descriptors.

To perform CRC calculations across all data received by and transmitted from the safety subsystem 160, the copy engine 190 may communicate datasets with a memory subsystem (e.g., DDR) within the safety subsystem 160. In communicating datasets with the memory subsystem(s) for purposes of performing CRC calculations on the datasets, firmware of the copy engine 190 may generate the source ring descriptors 502. Each generated source ring descriptor 502 may include a length bit (i.e., length of the dataset), an aggregation bit or gather bit (i.e., bit or bits indicating that the dataset is capable of being processed in a stream-wise parallel-channel manner for CRC calculations, as opposed to conventional packet-wise CRC calculating), a bit or multiple bits indicating a CRC type (e.g., type1, type2, type3, etc. defined by communications protocol standards), and a source data pointer (i.e., memory index).

A source data pointer may indicate a memory-mapped address and/or physical and/or virtual location at which a corresponding dataset is stored in the memory subsystem(s). For example, a processor (e.g.,182) in communication with the copy engine 190 may receive a communication including a dataset from a device (e.g., network device(s) 189) within the safety network 150.

The processor may forward the communication to the copy engine 190, and firmware of the copy engine 190 may generate a source ring descriptor 502 including the length bit, gather bit, CRC type, and source data pointer during the process of conveying the dataset to a memory subsystem. For example, the copy engine 190 may receive and copy a first dataset regarding communications from a cellular phone via a BLE connection, and may receive a second dataset regarding communications from a wireless charging station via a WiFi connection.

The copy engine 190 may generate a first source ring descriptor with a CRC type indicating that the first dataset should be and will be processed according to a BLE CRC processing standard, may subsequently generate a second source ring descriptor with a CRC type indicating that the second dataset should be processed according to a WiFi CRC processing standard, and may then load or otherwise store the first source ring descriptor and the second source ring descriptor as an ordered stack within firmware.

The copy engine 190 may detect when a source ring descriptor 502 has been generated based on datasets. After the copy engine 190 detects that there are source ring descriptors 502 within populated length, gather, CRC-type, and source data pointer bits stored within firmware, the copy engine 190 may locate the corresponding datasets according to each source data pointer, and may copy the datasets from the memory-mapped area to the copy engine buffer 194. The copy engine 190 may simultaneously generate the destination ring descriptors and status ring descriptors based on the dataset copies while performing parallel CRC calculations on the dataset copies via the stream-wise CRC engines 192. For example, a first dataset and a second dataset may be copied from firmware address locations identified by a first source data pointer and a second data pointer of a first source ring descriptor (e.g., 502-1) and a second source ring descriptor (e.g., 502-2) respectively, resulting in a first dataset copy and a second dataset copy stored by the copy engine buffer 194.

The copy engine 190 may generate a first and second status ring descriptor (e.g., 504-1, 504-2) and a first and second destination ring descriptor (e.g., 506-1, 506-2) based on the first dataset copy and the second dataset copy respectively. After copying each dataset to obtain the dataset copies, the copy engine 190 may update the first destination ring descriptor with a length bit and destination data pointer and the second destination ring descriptor with a length bit and destination data pointer (i.e., memory index indicating where the to-be calculated/generated CRC will be transmitted to). The first status ring descriptor and the second status ring descriptor may be generated to include a length and a gather bit.

The copy engine 190 may perform the following tasks in parallel (i.e., at the same or substantially the same time/ within a same time window) as soon as the datasets are copied to the copy engine 190: (i) perform a first CRC calculation according to the CRC-type of the first source ring descriptor via a first stream-wise CRC engine (e.g., 192-1); (ii) perform a second CRC calculation according to the CRC-type of the second source ring descriptor via a second stream-wise CRC engine (e.g., 192-2).

Upon the completion of a CRC calculation of the first dataset copy and/or the second dataset copy, the corresponding status ring descriptors 504 may be each updated to include a final generated CRC based on each dataset copy. The first status ring descriptor and the second status ring descriptor may be updated according to the order in which the CRC calculations performed by the first stream-wise CRC engine and the second stream-wise CRC engine are completed. For example, the first stream-wise CRC engine may complete CRC calculations on the first dataset copy prior to the second stream-wise CRC engine completing CRC calculations on the second dataset copy. Thus, the copy engine 190 may update the first status ring descriptor with the generated CRC for the first dataset copy prior to updating the second status ring descriptor with the generated CRC for the second dataset copy.

As another example, the second stream-wise CRC engine may complete CRC calculations on the second dataset copy prior to the first stream-wise CRC engine completing CRC calculations on the first dataset copy (e.g., first stream-wise CRC engine may be calculating CRC according to a more rigorous, time-consuming standard). Thus, the copy engine 190 may update the second status ring descriptor with the generated CRC for the second dataset copy prior to updating the first status ring descriptor with the generated CRC for the first dataset copy.

FIG. 6 is block diagram of a stream-wise CRC engine implemented within a channel of a copy engine according to various embodiments. With reference to FIGS. 1A-6, the stream-wise CRC engine 192 may be one of any number N of stream-wise CRC engines 192 of the copy engine 190.

Based on metadata from a source ring descriptor, the stream-wise CRC engine 192 may calculate or otherwise generate the CRC for a dataset copy. The metadata may include the CRC-type, which allows the stream-wise CRC engine 192 to enable calculation of a dataset copy according to the CRC-type (i.e., CRC protocols as defined by the communications standard type).

A dataset copy may be provided (i.e., via "Data stream_in) to CRC circuitry 604 (hardware components not illustrated) based on the metadata enabling or otherwise activating that hardware to process the dataset copy. For example, the metadata may indicate a CRC-type2 (e.g., BLE CRC protocol), and may enable the CRC circuitry 604 for CRC-type2 via the "enable2" signal.

The dataset copy may be streamed into the CRC circuitry 604 for a CRC-type 2 calculation. After processing, the CRC data may be output to CRC_out, and MUXed (and/or reflected if necessary according to the AUTOSAR standard for CRC) to obtain the final CRC for that dataset copy. The final CRC may then be updated in the corresponding status ring descriptor 504.

In some embodiments, the stream-wise CRC engine 192 may process more than one dataset copy prior to obtaining the final CRC. For example, a first stream-wise CRC engine may process a sequence of more than one dataset copy. This process of analyzing the CRC of more than one dataset copy in a row before finding a final CRC may also be performed in parallel with a second stream-wise CRC engine separately processing a different sequence of more than one dataset copy (i.e., as described with reference to FIG. 7).

A group of two or more dataset copies may be referred to as a dataset stream, in which each dataset copy within a dataset stream has CRC sequentially calculated or generated and fed back into the CRC circuitry depending on CRC-type until a last dataset copy of the dataset stream is processed and a final CRC is calculated or otherwise generate. Thus, the stream-wise CRC engine 192 may calculate or otherwise generate a final CRC for a number of dataset copies, which may be a same CRC type or different CRC types.

CRC is calculated for every dataset, and a stream-wise CRC is calculated for multiple datasets within a dataset stream that are linked with multiple source ring descriptors. An end (i.e., last dataset within a dataset stream) of a dataset stream may be indicated by the gather bit being not set in the source ring descriptor associated with that dataset stream. One status descriptor and one CRC may be updated for multiple datasets that form a single dataset stream. Comparatively, if the communication protocol is a packet-based protocol, CRC is generated for every dataset, the gather bit is not set, and a one-to-one mapping from source ring descriptor to status ring descriptor with each generated CRC occurs.

For example, each dataset copy within a dataset stream may be fed into the CRC circuitry 604 according to the CRC-type and length defined by the metadata according to each source ring descriptor for each dataset copy in the dataset stream. For example, a dataset stream may include a first dataset copy and a second dataset copy, each identifiable by a first source ring descriptor and a second ring descriptor respectively. The first source ring descriptor may indicate that the first dataset copy has a length of 56-bit, a CRC-type3 (e.g., WiFi), and a gather bit (i.e., indicating that the dataset copy is part of a dataset stream), and the second ring descriptor may indicate that the second dataset copy has a length of 16 bits, a CRC-type2 (e.g., BLE), and a gather bit. Accordingly, the metadata in the firmware of the copy engine 190 may enable the CRC-type3 of the CRC circuitry 604 of the stream-wise CRC engine 192; and the first dataset copy may be processed to determine a CRC. As the first dataset copy is part of a dataset stream as indicated by the gather bit, the first calculated or generated CRC value is MUXed back into the CRC circuitry 604 via the "Feedback CRC" connection. The metadata in the firmware of the copy engine 190 may then enable the CRC-type2 of the CRC circuitry 604 of the stream-wise CRC engine 192; and the second dataset copy may be processed to determine a CRC along with the feedback CRC value from the CRC calculation of the first dataset copy. This process may be repeated until a last dataset copy of a dataset stream has a CRC calculated or generated, upon which a final CRC is determined.

Figure 7:
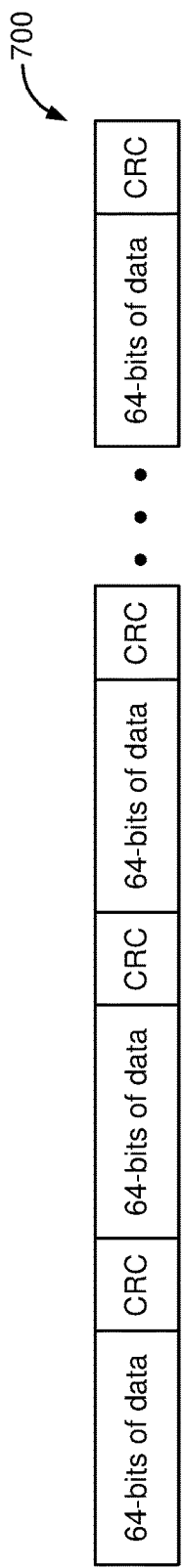
FIG. 7 is block diagram of a conventional packet-wise CRC message conveyed across a bus.

FIG. 7 is block diagram illustrating a conventional packet-wise CRC message 700 for a data payload of 4K bytes conveyed across a bus. Assuming a 32-bit CRC overhead per packet, the packet-wise CRC message 700 may include a total number of bits according to the following formula: 4096bits[Data]+(64 No of packets x 32-bit CRC per packet)=4096+2048=150% of payload. Thus, the conventional packet-wise CRC message 700 may include 100% Payload data plus 50% overhead due to packet-wise CRC addition if CRC is handled in hardware.

Figure 8:
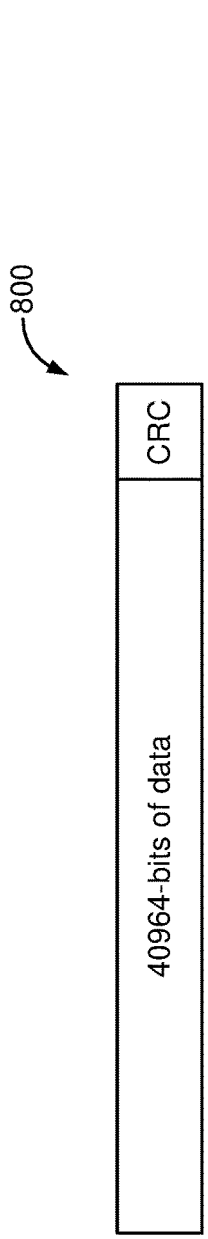
FIG. 8 is a block diagram of a stream-wise CRC message conveyed across a bus according to various embodiments.

FIG. 8 is a block diagram illustrating a stream-wise CRC message 800 for a data payload of 4K bytes conveyed across a bus according to various embodiments. With reference to FIGS. 1A-8, assuming 32-bit CRC, the stream-wise CRC message 800 may include a total number of bits according to the following formula: 4096bits[Data]+32-bit CRC uploaded in s/w=100% of payload. Thus, the stream-wise CRC message 800 may include 100% Payload data plus CRC checksum additions in the data payload if CRC is handled in hardware. The integrity of the CRC data may be ensured by offloading the CRC overhead to the source ring descriptors 502, the status ring descriptors 504, and the destination ring descriptors 506 in firmware while providing zero overhead in the payload due to CRC addition. A reduced-overhead stream-wise CRC message 800 allows for transmitting data payloads and corresponding CRC values across an interface bus more efficiently, thereby reducing computational resources used and time required by a receiving processor for unpacking and utilizing the stream-wise CRC message 800 as compared to the packet-wise CRC message 700.

Figure 9:
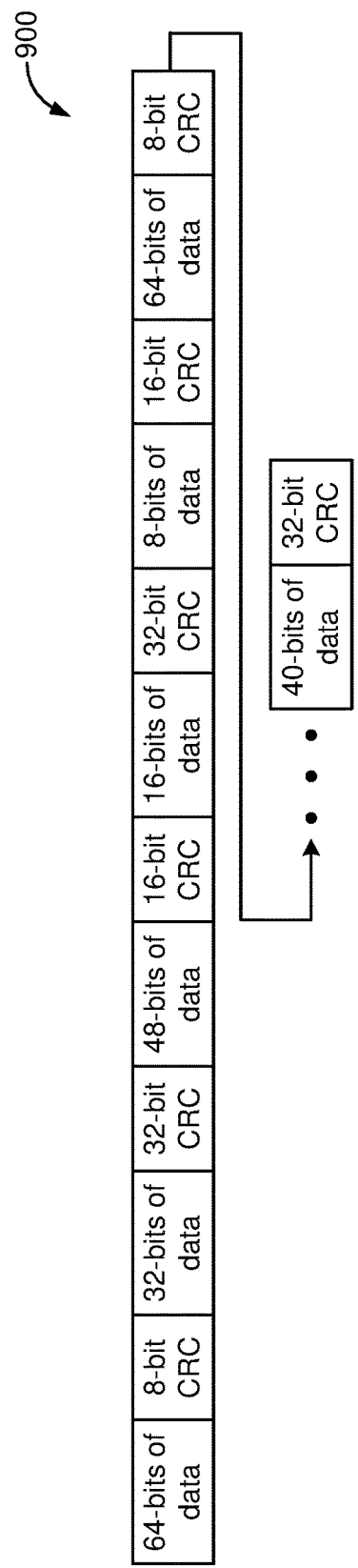
FIG. 9 is a block diagram of an example dataset stream according to various embodiments.

FIG. 9 is a block diagram illustrating an example of a dataset stream 900 according to various embodiments. With reference to FIGS. 1A-9, the dataset stream 900 illustrates that multiple CRC datasets of varying CRC type may be supported within a single channel. Data widths supported within the dataset stream 900 may include 64-bit, 56-bit, 48-bit, 40-bit, 32-bit, 24-bit, 16-bit, and 8-bit data widths. Protocols supported by the dataset stream 900 may include CRC-8-SAE data sharing protocol in vehicles, CRC-8-2F open safety protocol, CRC-16 CCITT modem/Bluetooth/DigRF protocol, CRC-32P4 AUTOSAR safety protocol, CRC-32 Ethernet IEEE 802.3, and any other known CRC protocols.

Figure 10A:
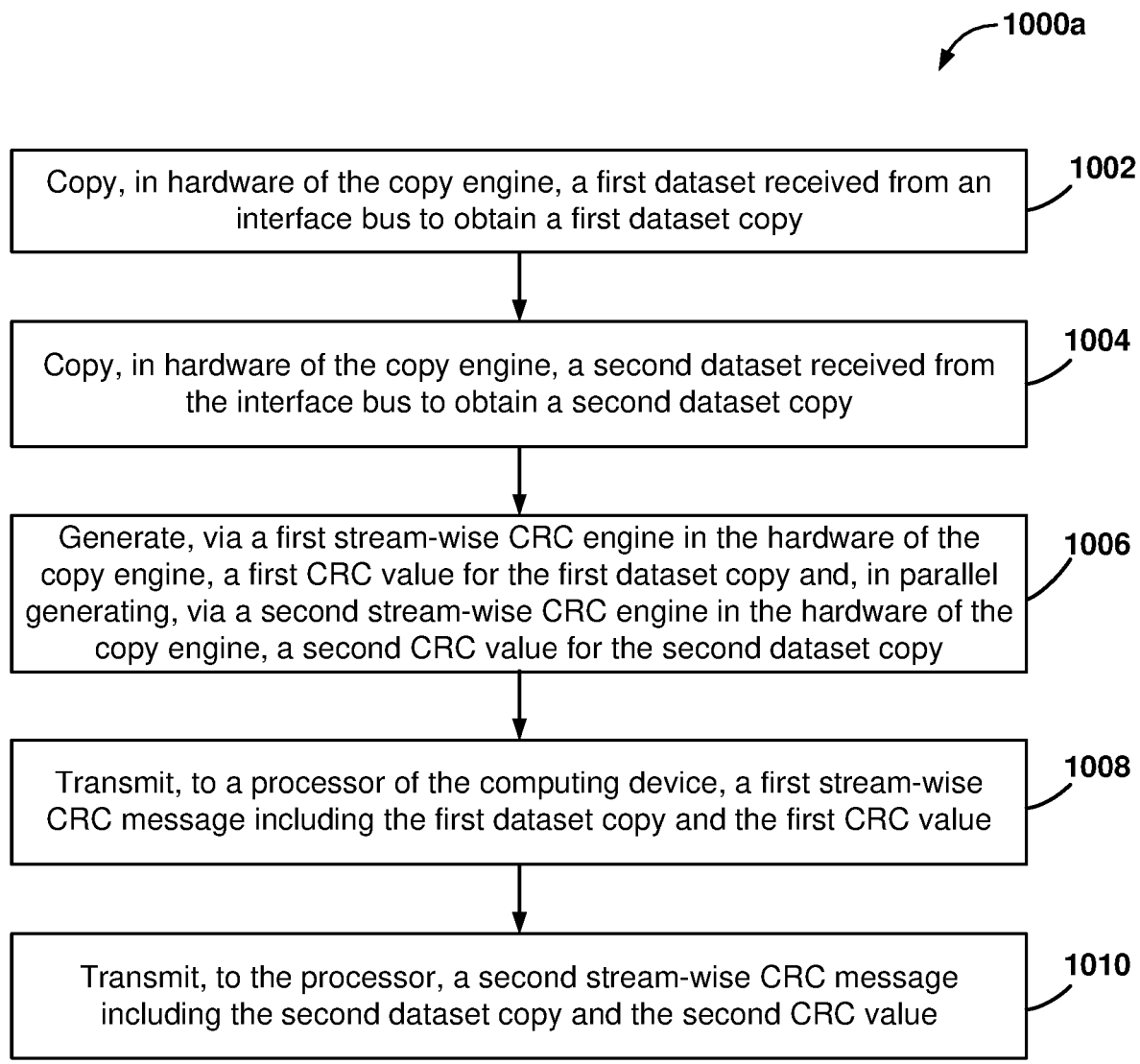
FIG. 10A is a process flow diagram of a method for generating a CRC in a safety network in accordance with various embodiments.

FIG. 10A is a process flow diagram of an example method 1000a that may be performed by a processor of a receiving wireless device for generating a cyclic redundancy check (CRC) in a safety network (e.g., safety network 150) in accordance with various embodiments. FIGS. 10B-10E are process flow diagrams of example operations 1000b-1000e that may be performed as part of the method 1000a as described for generating a CRC in a safety network in accordance with some embodiments. With reference to FIGS. 1A-10E, the method 1000a and the operations 1000b-1000e may be performed by a copy engine (e.g., processor 182, 210, 212, 214, 216, 218, 252, 260, 422, copy engine 190) of a computing device (e.g., safety subsystem 180, wireless computing device 120, vehicle 152b, network devices 189). In some embodiments, the copy engine (e.g., processor 182, 210, 212, 214, 216, 218, 252, 260, 422, copy engine 190) may be configured to perform the operations by processor-executable instruction stored in a non-transitory processor-readable medium (e.g., 220, 258, 420). Means for performing each of the operations of the method 1000a and the operations 1000b-1000e may be a processor of the systems 100, 160, 200, 300, and 1100, such as the processors 210, 212, 214, 216, 218, 252, 260, 422, the copy engine 190, and/or the like as described with reference to FIGS. 1A-6, and 8-10E.

In block 1002, the copy engine of the computing device may perform operations including copying, in hardware of the copy engine, a first dataset received from an interface bus to obtain a first dataset copy. For example, a copy engine (e.g., copy engine 190) may receive a communication across an interface bus (e.g., AXI, interconnection/bus module 226, 264) including a dataset, and may copy the dataset to a copy engine buffer (e.g., copy engine buffer 194) in hardware of the copy engine. In some embodiments, copying, in hardware of the copy engine, the first dataset received from the interface bus to obtain the first dataset copy may further include copying the first dataset based on a first source data pointer (i.e., of a first source ring descriptor). Means for performing the operations of block 1002 may include a processor (e.g., 182, 210, 212, 214, 216, 218, 252, 260, 422, copy engine 190) of a safety subsystem (e.g., 180) executing the dataset copy module 430.

In block 1004, the copy engine of the computing device may perform operations including copying, in hardware of the copy engine, a second dataset received from the interface bus to obtain a second dataset copy. For example, a copy engine (e.g., copy engine 190) may receive a communication across an interface bus (e.g., AXI, interconnection/bus module 226, 264) including a dataset, and may copy the dataset to a copy engine buffer (e.g., copy engine buffer 194) in hardware of the copy engine. In some embodiments, copying, in hardware of the copy engine, the second dataset received from the interface bus to obtain the second dataset copy may further include copying the second dataset based on the second source data pointer (i.e., of a second source ring descriptor). Means for performing the operations of block 1004 may include a processor (e.g., 182, 210, 212, 214, 216, 218, 252, 260, 422, copy engine 190) of a safety subsystem (e.g., 180) executing the dataset copy module 430.

In block 1006, the copy engine of the computing device may perform operations including generating, via a first stream-wise CRC engine (e.g., 192-1) in the hardware of the copy engine, a first CRC value for the first dataset copy and, in parallel generating, via a second stream-wise CRC engine (e.g., 192-2) in the hardware of the copy engine (e.g., 190), a second CRC value for the second dataset copy. The parallel timewise generation of the first CRC value and the second CRC value may be performed in separate Channels (e.g., Channel 1, Channel 2), with each Channel including a set and/or stack of ring descriptor (e.g., 502, 504, 506) and a stream-wise CRC engine 192. Means for performing the operations of block 1006 may include a processor (e.g., 182, 210, 212, 214, 216, 218, 252, 260, 422, copy engine 190) of a safety subsystem (e.g., 180) executing the CRC generation module 432.

In some embodiments, generating, via the first stream-wise CRC engine, the first CRC value for the first dataset copy in block 1006 may further include generating, via the first stream-wise CRC engine, the first CRC value for the first dataset copy based on a first CRC type indicating a first communication protocol.

In some embodiments, generating, via the second stream-wise CRC engine, the second CRC value for the second dataset copy in block 1006 may further include generating, via the second stream-wise CRC engine, the second CRC value for the second dataset copy based on a second CRC type indicating a second communication protocol. In some embodiments, the first CRC type and the second CRC type may be different CRC types or may be the same CRC type.

In some embodiments, generating, via the first stream-wise CRC engine in the hardware of the copy engine, the first CRC value for the first dataset copy and, in parallel generating, via the second stream-wise CRC engine in the hardware of the copy engine, the second CRC value for the second dataset copy in block 1006 may further include generating, via the first stream-wise CRC engine, a final CRC value, in which the final CRC value may be generated using the third dataset copy and the first CRC value.

In block 1008, the copy engine (e.g., 190) of the computing device may perform operations including transmitting, to a processor (e.g., 182, 210, 212, 214, 216, 218, 252, 260, 422) of the computing device (e.g., safety subsystem 180), a first stream-wise CRC message including the first dataset copy and the first CRC value. In some embodiments, transmitting the first stream-wise CRC message may further include transmitting the first stream-wise CRC message based on the first destination data pointer (e.g., of a first destination ring descriptor 506-1). In some embodiments, transmitting, to the processor, the first stream-wise CRC message may further include transmitting, to the processor, the first stream-wise CRC message including the first dataset copy, the third dataset copy, and the final CRC value. Means for performing the operations of block 1008 may include a processor (e.g., 182, 210, 212, 214, 216, 218, 252, 260, 422, copy engine 190) of a safety subsystem (e.g., 180) executing the transmit/receive module 444.

In block 1010, the copy engine (e.g., 190) of the computing device may perform operations including transmitting, to the processor (e.g., 182, 210, 212, 214, 216, 218, 252, 260, 422), a second stream-wise CRC message including the second dataset copy and the second CRC value. In some embodiments, transmitting the second stream-wise CRC message may further include transmitting the second stream-wise CRC message based on the second destination data pointer (e.g., of a second destination ring descriptor 506-2). Means for performing the operations of block 1010 may include a processor (e.g., 182, 210, 212, 214, 216, 218, 252, 260, 422, copy engine 190) of a safety subsystem (e.g., 180) executing the transmit/receive module 444.

Figure 10B:
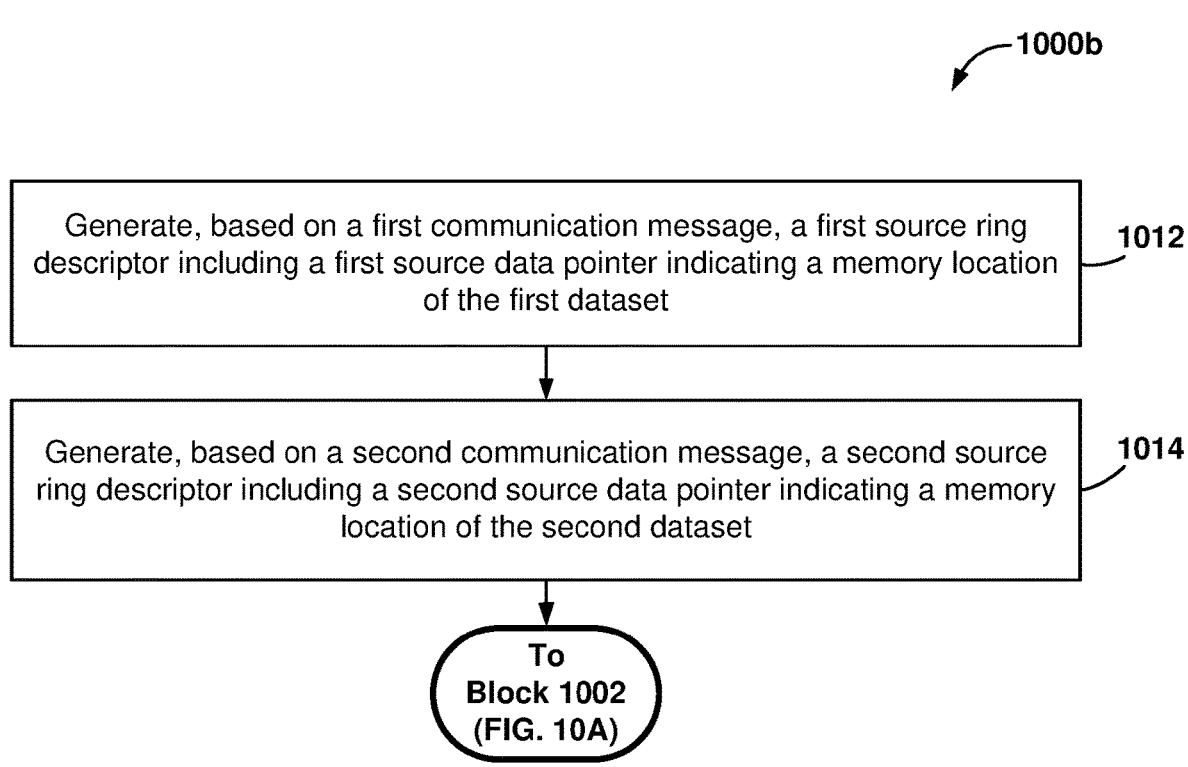
FIGS. 10B-10E are process flow diagrams of operations 1000b-1000e that may be performed as part of methods for generating a CRC in a safety network in accordance with some embodiments.

FIG. 10B illustrates operations 1000b that may be performed as part of the method 1000a for generating a CRC in a safety network in accordance with some embodiments. With reference to FIGS. 1A-10B, the copy engine (e.g., 190) of the computing device (e.g., safety subsystem 180) may perform operations including generating, based on a first communication message, a first source ring descriptor (e.g., 502-1) including a first source data pointer indicating a memory location of the first dataset in block 1012. In some embodiments, the first source ring descriptor may include a first length bit indicating a length of the first dataset, a first gather bit indicating the first CRC value is generated as part of a first dataset stream including multiple datasets, and a first CRC type indicating a first communication protocol. Means for performing the operations of block 1012 may include a processor (e.g., 182, 210, 212, 214, 216, 218, 252, 260, 422, copy engine 190) of a safety subsystem (e.g., 180) executing the ring descriptor generation module 434.

In block 1014, the copy engine (e.g., 190) of the computing device (e.g., safety subsystem 180) may perform operations including generating, based on a second communication message, a second source ring descriptor (e.g., 502-2) including a second source data pointer indicating a memory location of the second dataset. In some embodiments, the second source ring descriptor may include a second length bit indicating a length of the second dataset, a second gather bit indicating the second CRC value is generated as part of a second dataset stream including multiple datasets, and a second CRC type indicating a second communication protocol. Means for performing the operations of block 1014 may include a processor (e.g., 182, 210, 212, 214, 216, 218, 252, 260, 422, copy engine 190) of a safety subsystem (e.g., 180) executing the ring descriptor generation module 434.

After the operations in block 1014, the copy engine may perform the operations in block 1002 as described.

Figure 10C:
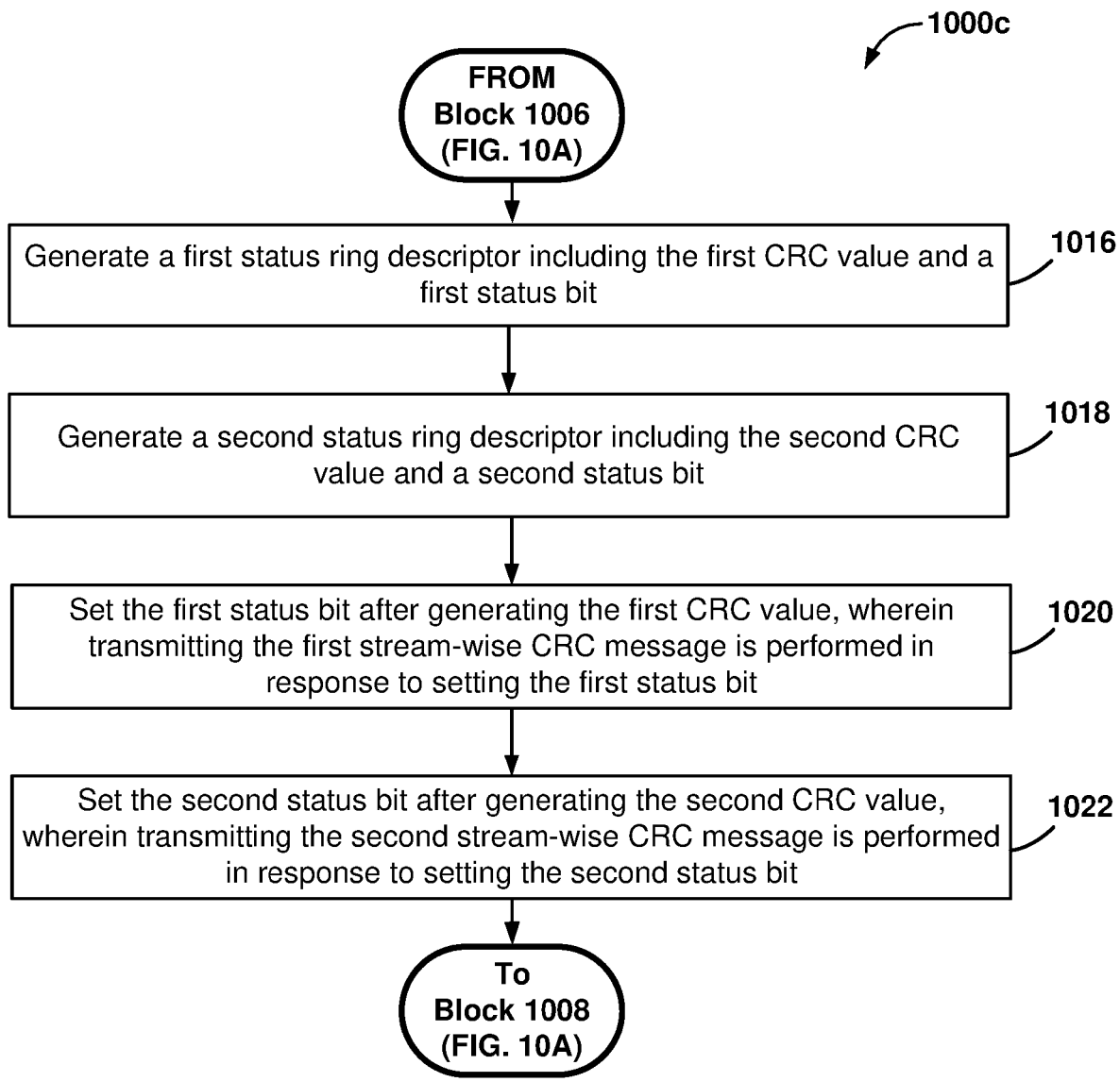

FIG. 10C illustrates operations 1000c that may be performed as part of the method 1000a for generating a CRC in a safety network in accordance with some embodiments. With reference to FIGS. 1A-10C, following the operations in block 1006, the copy engine (e.g., 190) of the computing device (e.g., safety subsystem 180) may perform operations including generating a first status ring descriptor (e.g., 504-1) including the first CRC value and a first status bit in block 1016. Means for performing the operations of block 1016 may include a processor (e.g., 182, 210, 212, 214, 216, 218, 252, 260, 422, copy engine 190) of a safety subsystem (e.g., 180) executing the ring descriptor generation module 434.

In block 1018, the copy engine (e.g., 190) of the computing device (e.g., safety subsystem 180) may perform operations including generating a second status ring descriptor (e.g., 504-2) including the second CRC value and a second status bit. Means for performing the operations of block 1018 may include a processor (e.g., 182, 210, 212, 214, 216, 218, 252, 260, 422, copy engine 190) of a safety subsystem (e.g., 180) executing the ring descriptor generation module 434.

In block 1020, the copy engine (e.g., 190) of the computing device (e.g., safety subsystem 180) may perform operations including setting the first status bit after generating the first CRC value, in which transmitting the first stream-wise CRC message may be performed in response to setting the first status bit. Means for performing the operations of block 1020 may include a processor (e.g., 182, 210, 212, 214, 216, 218, 252, 260, 422, copy engine 190) of a safety subsystem (e.g., 180) executing the ring descriptor update module 436.

In block 1022, the copy engine (e.g., 190) of the computing device (e.g., safety subsystem 180) may perform operations including setting the second status bit after generating the second CRC value, wherein transmitting the second stream-wise CRC message is performed in response to setting the second status bit. Means for performing the operations of block 1022 may include a processor (e.g., 182, 210, 212, 214, 216, 218, 252, 260, 422, copy engine 190) of a safety subsystem (e.g., 180) executing the ring descriptor update module 436.

The order of operations as described with reference to block 1002-1022 is merely illustrative and not exhaustive. For example, the operations as described with reference to block 1016 and 1018 may be performed prior to, during, or after the operations as described with reference to block 1006.

After the operations in block 1022, the copy engine may perform the operations in block 1008 as described.

Figure 10D:
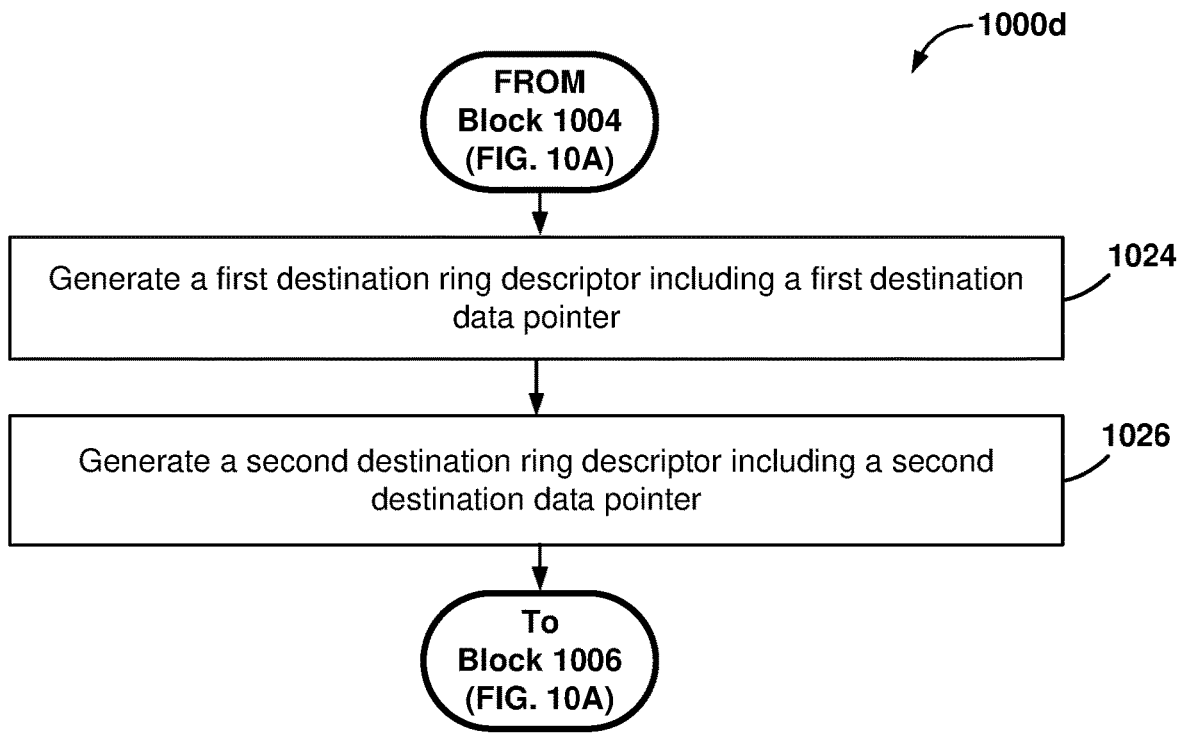

FIG. 10D illustrates operations 1000*d* that may be performed as part of the method 1000*a* for generating a CRC in a safety network in accordance with some embodiments. With reference to FIGS. 1A-10D, following the operations in block 1004, the copy engine (e.g., 190) of the computing device (e.g., safety subsystem 180) may perform operations including generating a first destination ring descriptor (e.g., 506-1) including a first destination data pointer in block 1024. Means for performing the operations of block 1024 may include a processor (e.g., 182, 210, 212, 214, 216, 218, 252, 260, 422, copy engine 190) of a safety subsystem (e.g., 180) executing the ring descriptor generation module 434.

In block 1026, the copy engine (e.g., 190) of the computing device (e.g., safety subsystem 180) may perform operations including generating a second destination ring descriptor (e.g., 506-2) including a second destination data pointer. Means for performing the operations of block 1026 may include a processor (e.g., 182, 210, 212, 214, 216, 218, 252, 260, 422, copy engine 190) of a safety subsystem (e.g., 180) executing the ring descriptor generation module 434.

After the operations in block 1026, the copy engine may perform the operations in block 1006 as described.

Figure 10E:
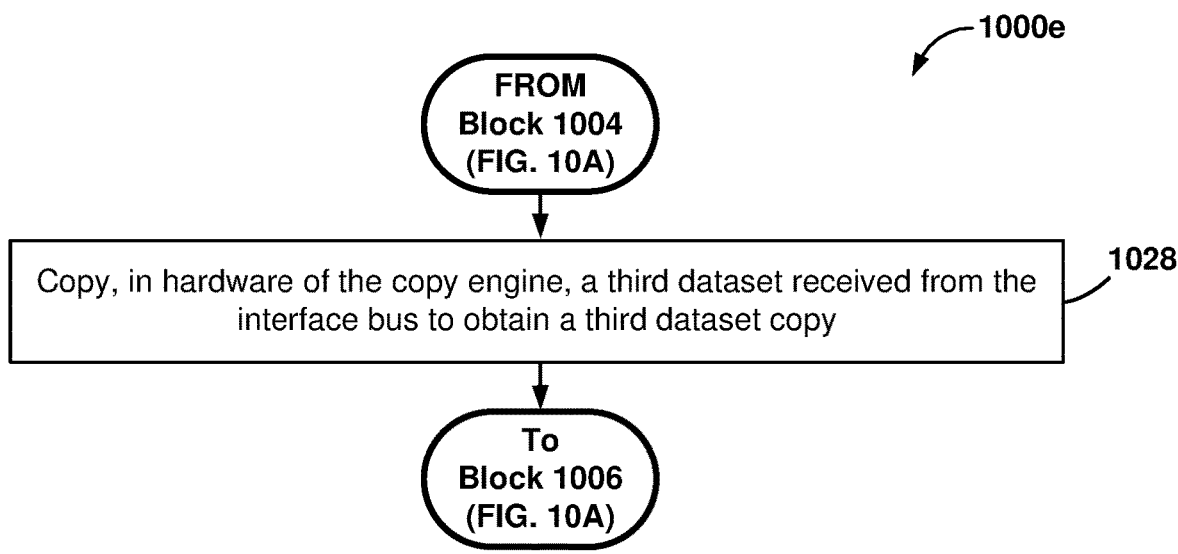

FIG. 10E illustrates operations 1000*e* that may be performed as part of the method 1000*a* for generating a CRC in a safety network in accordance with some embodiments. With reference to FIGS. 1A-10E, following the operations in block 1004, the copy engine (e.g., 190) of the computing device (e.g., safety subsystem 180) may perform operations including copying, in hardware of the copy engine (e.g., copy engine buffer 194), a third dataset received from the interface bus to obtain a third dataset copy. Means for performing the operations of block 1028 may include a processor (e.g., 182, 210, 212, 214, 216, 218, 252, 260, 422, copy engine 190) of a safety subsystem (e.g., 180) executing the dataset copy module 430.

After the operations in block 1028, the copy engine may perform the operations in block 1006 as described.

Figure 11:
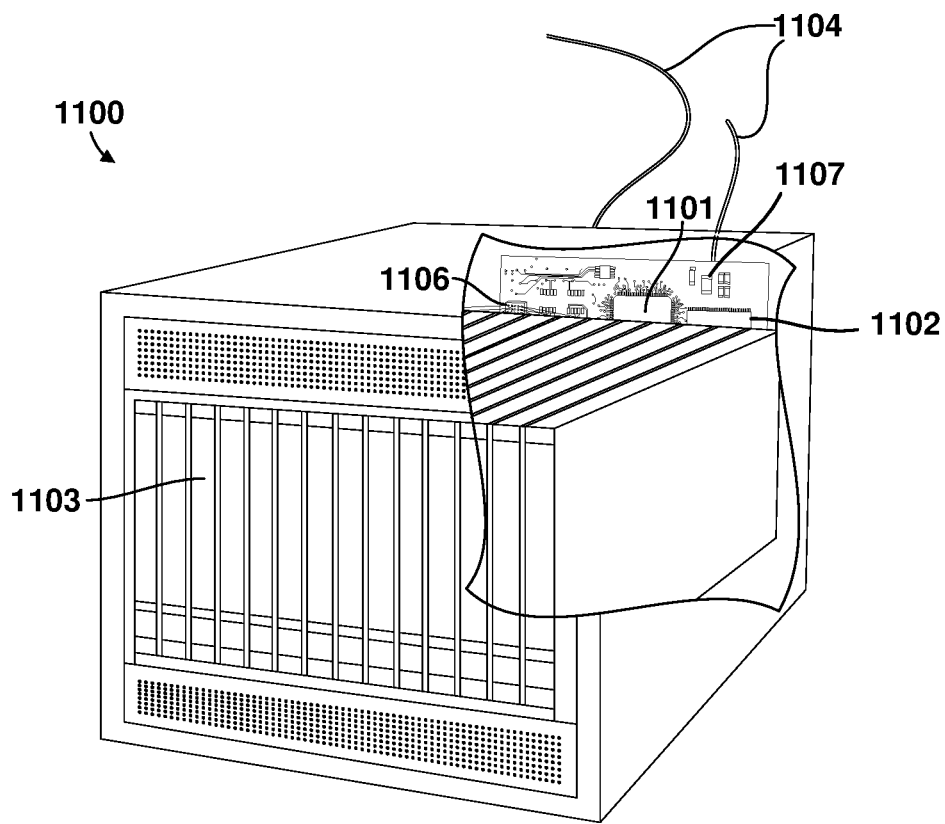
FIG. 11 is a component block diagram of a network computing device 1100, such as a safety subsystem, suitable for use with various embodiments.

Various embodiments may be implemented on a variety of network devices, an example of which is illustrated in FIG. 11 in the form of a network computing device 1100 functioning as a network element of a communication network, such as a base station. Such network computing devices may include at least the components illustrated in FIG. 11. With reference to FIGS. 1-11, the network computing device 1100 may typically include a processor 1101 coupled to volatile memory 1102 and a large capacity nonvolatile memory, such as a disk drive 1103. The network computing device 1100 may also include a peripheral memory access device such as a floppy disc drive, compact disc (CD) or digital video disc (DVD) drive 1106 coupled to the processor 1101. The network computing device 1100 may also include network access ports 1104 (or interfaces) coupled to the processor 1101 for establishing data connections with a network, such as the Internet and/or a local area network coupled to other system computers and servers. The network computing device 1100 may include one or more antennas 1107 for sending and receiving electromagnetic radiation that may be connected to a wireless communication link. The network computing device 1100 may include additional access ports, such as USB, Firewire, Thunderbolt, and the like for coupling to peripherals, external memory, or other devices.

The processors of the wireless network computing device 1100 may be any programmable microprocessor, microcomputer or multiple processor chip or chips that can be configured by software instructions (applications) to perform a variety of functions, including the functions of the various embodiments described below. In some wireless computing devices, multiple processors may be provided, such as one processor within an SoC 204 dedicated to wireless communication functions and one processor within an SoC 202 dedicated to running other applications. Typically, software applications may be stored in the memory 1102, 1103 before they are accessed and loaded into the processor. The processors may include internal memory sufficient to store the application software instructions.

Implementation examples are described in the following paragraphs. While some of the following implementation examples are described in terms of example methods, further example implementations may include: the example methods discussed in the following paragraphs implemented by a computing device including a processor configured with processor-executable instructions to perform operations of the methods of the following implementation examples; the example methods discussed in the following paragraphs implemented by a computing device including means for performing functions of the methods of the following implementation examples; and the example methods discussed in the following paragraphs may be implemented as a non-transitory processor-readable storage medium having stored thereon processor-executable instructions configured to cause a processor of a computing device to perform the operations of the methods of the following implementation examples.

Example 1: A method performed by a copy engine of a computing device for generating a cyclic redundancy check (CRC) in a safety network, including: copying, in hardware of the copy engine, a first dataset received from an interface bus to obtain a first dataset copy; copying, in hardware of the copy engine, a second dataset received from the interface bus to obtain a second dataset copy; generating, via a first stream-wise CRC engine in the hardware of the copy engine, a first CRC value for the first dataset copy and, in parallel generating, via a second stream-wise CRC engine in the hardware of the copy engine, a second CRC value for the second dataset copy; transmitting, to a processor of the computing device, a first stream-wise CRC message including the first dataset copy and the first CRC value; and transmitting, to the processor, a second stream-wise CRC message including the second dataset copy and the second CRC value.

Example 2: The method of example 1, further including: generating, based on a first communication message, a first source ring descriptor including a first source data pointer indicating a memory location of the first dataset; and generating, based on a second communication message, a second source ring descriptor including a second source data pointer indicating a memory location of the second dataset.

Example 3: The method of either or examples 1 or 2, in which copying, in hardware of the copy engine, the first dataset received from the interface bus to obtain the first dataset copy further includes copying the first dataset based on the first source data pointer, and copying, in hardware of the copy engine, the second dataset received from the interface bus to obtain the second dataset copy further includes copying the second dataset based on the second source data pointer.

Example 4: The method of any of examples 1-3, in which the first source ring descriptor includes a first length bit indicating a length of the first dataset, a first gather bit indicating the first CRC value is generated as part of a first dataset stream including multiple datasets, and a first CRC type indicating a first communication protocol, and in which the second source ring descriptor includes a second length bit indicating a length of the second dataset, a second gather bit indicating the second CRC value is generated as part of a second dataset stream including multiple datasets, and a second CRC type indicating a second communication protocol.

Example 5: The method of any of examples, 1-4, in which generating, via the first stream-wise CRC engine, the first CRC value for the first dataset copy further includes generating, via the first stream-wise CRC engine, the first CRC value for the first dataset copy based on a first CRC type indicating a first communication protocol, and generating, via the second stream-wise CRC engine, the second CRC value for the second dataset copy further includes generating, via the second stream-wise CRC engine, the second CRC value for the second dataset copy based on a second CRC type indicating a second communication protocol.

Example 6: The method of example 5, in which the first CRC type and the second CRC type are different CRC types.

Example 7: The method of any of examples 1-6, further including: generating a first status ring descriptor including the first CRC value and a first status bit; generating a second status ring descriptor including the second CRC value and a second status bit; setting the first status bit after generating the first CRC value, in which transmitting the first stream-wise CRC message is performed in response to setting the first status bit; and setting the second status bit after generating the second CRC value, in which transmitting the second stream-wise CRC message is performed in response to setting the second status bit.

Example 8: The method of any of examples, 1-7, further including: generating a first destination ring descriptor including a first destination data pointer; and generating a second destination ring descriptor including a second destination data pointer, in which transmitting the first stream-wise CRC message further includes transmitting the first stream-wise CRC message based on the first destination data pointer, and in which transmitting the second stream-wise CRC message further includes transmitting the second stream-wise CRC message based on the second destination data pointer.

Example 9: The method of any of examples 1-8, further including: copying, in hardware of the copy engine, a third dataset received from the interface bus to obtain a third dataset copy, in which generating, via the first stream-wise CRC engine in the hardware of the copy engine, the first CRC value for the first dataset copy and, in parallel generating, via the second stream-wise CRC engine in the hardware of the copy engine, the second CRC value for the second dataset copy further includes generating, via the first stream-wise CRC engine, a final CRC value, in which the final CRC value is generated using the third dataset copy and the first CRC value, and in which transmitting, to the processor, the first stream-wise CRC message further includes transmitting, to the processor, the first stream-wise CRC message including the first dataset copy, the third dataset copy, and the final CRC value.

As used in this application, the terms "component," "module," "system," and the like are intended to include a computer-related entity, such as, but not limited to, hardware, firmware, a combination of hardware and software, software, or software in execution, which are configured to perform particular operations or functions. For example, a component may be, but is not limited to, a process running on a processor, a processor, an object, an executable, a thread of execution, a program, and/or a computer. By way of illustration, both an application running on a computing device and circuitry (e.g., an SoC) of the computing device may be referred to as a component. One or more components may reside within a process and/or thread of execution and a component may be localized on one processor or core and/or distributed between two or more processors or cores. In addition, these components may execute from various non-transitory computer readable media having various instructions and/or data structures stored thereon. Components may communicate by way of local and/or remote processes, function or procedure calls, electronic signals, data packets, memory read/writes, and other known network, computer, processor, and/or process related communication methodologies.

A number of different cellular and mobile communication services and mid-range and short-range and/or near-field communications standards are available or contemplated in the future, all of which may implement and benefit from the various embodiments. Such services and standards include, e.g., third generation partnership project (3GPP), long term evolution (LTE) systems, third generation wireless mobile communication technology (3G), fourth generation wireless mobile communication technology (4G), fifth generation wireless mobile communication technology (5G), global system for mobile communications (GSM), universal mobile telecommunications system (UMTS), 3GSM, general packet radio service (GPRS), code division multiple access (CDMA) systems (e.g., cdmaOne, CDMA1020TM), enhanced data rates for GSM evolution (EDGE), advanced mobile phone system (AMPS), digital AMPS (IS-136/TDMA), evolution-data optimized (EV-DO), digital enhanced cordless telecommunications (DECT), Worldwide Interoperability for Microwave Access (WiMAX), wireless local area network (WLAN), Wi-Fi Protected Access I & II (WPA, WPA2), and integrated digital enhanced network (iDEN), Bluetooth, BLE, WiFi, and DigRF. Each of these technologies involves, for example, the transmission and reception of voice, data, signaling, and/or content messages. It should be understood that any references to terminology and/or technical details related to an individual telecommunication standard or technology are for illustrative purposes only, and are not intended to limit the scope of the Claims to a particular communication system or technology unless specifically recited in the claim language.

Various embodiments illustrated and described are provided merely as examples to illustrate various features of the claims. However, features shown and described with respect to any given embodiment are not necessarily limited to the associated embodiment and may be used or combined with other embodiments that are shown and described. Further, the claims are not intended to be limited by any one example embodiment. For example, one or more of the operations of the methods 1000a-1000e may be substituted for or combined with one or more operations of the methods 1000a-1000e.

The foregoing method descriptions and the process flow diagrams are provided merely as illustrative examples and are not intended to require or imply that the operations of various embodiments must be performed in the order presented. As will be appreciated by one of skill in the art the order of operations in the foregoing embodiments may be performed in any order. Words such as "thereafter," "then," "next," etc. are not intended to limit the order of the operations; these words are used to guide the reader through the description of the methods. Further, any reference to claim elements in the singular, for example, using the articles "a," "an," or "the" is not to be construed as limiting the element to the singular.

Various illustrative logical blocks, modules, components, circuits, and algorithm operations described in connection with the embodiments disclosed herein may be implemented as electronic hardware, computer software, or combinations of both. To clearly illustrate this interchangeability of hardware and software, various illustrative components, blocks, modules, circuits, and operations have been described above generally in terms of their functionality. Whether such functionality is implemented as hardware or software depends upon the particular application and design constraints imposed on the overall system. Skilled artisans may implement the described functionality in varying ways for each particular application, but such embodiment decisions should not be interpreted as causing a departure from the scope of the claims.

The hardware used to implement various illustrative logics, logical blocks, modules, and circuits described in connection with the embodiments disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but, in the alternative, the processor may be any conventional processor, controller, microcontroller, or state machine. A processor may also be implemented as a combination of receiver smart objects, e.g., a combination of a DSP and a microprocessor, a plurality of microprocessors, one or more microprocessors in conjunction with a DSP core, or any other such configuration. Alternatively, some operations or methods may be performed by circuitry that is specific to a given function.

In one or more embodiments, the functions described may be implemented in hardware, software, firmware, or any combination thereof. If implemented in software, the functions may be stored as one or more instructions or code on a non-transitory computer-readable storage medium or non-transitory processor-readable storage medium. The operations of a method or algorithm disclosed herein may be embodied in a processor-executable software module or processor-executable instructions, which may reside on a non-transitory computer-readable or processor-readable storage medium. Non-transitory computer-readable or processor-readable storage media may be any storage media that may be accessed by a computer or a processor. By way of example but not limitation, such non-transitory computer-readable or processor-readable storage media may include RAM, ROM, EEPROM, FLASH memory, CD-ROM or other optical disk storage, magnetic disk storage or other magnetic storage smart objects, or any other medium that may be used to store desired program code in the form of instructions or data structures and that may be accessed by a computer. Disk and disc, as used herein, includes compact disc (CD), laser disc, optical disc, digital versatile disc (DVD), floppy disk, and Blu-ray disc where disks usually reproduce data magnetically, while discs reproduce data optically with lasers. Combinations of the above are also included within the scope of non-transitory computer-readable and processor-readable media. Additionally, the operations of a method or algorithm may reside as one or any combination or set of codes and/or instructions on a non-transitory processor-readable storage medium and/or computer-readable storage medium, which may be incorporated into a computer program product.

The preceding description of the disclosed embodiments is provided to enable any person skilled in the art to make or use the claims. Various modifications to these embodiments will be readily apparent to those skilled in the art, and the generic principles defined herein may be applied to other embodiments without departing from the scope of the claims. Thus, the present disclosure is not intended to be limited to the embodiments shown herein but is to be accorded the widest scope consistent with the following claims and the principles and novel features disclosed herein.

What is claimed is:

1. A computing device for use in a safety network, comprising:
    an interface bus;
    a copy engine coupled to the interface bus, the copy engine comprising:
        a copy engine buffer in hardware of the copy engine configured to store data sets as dataset copies;
        a first stream-wise cyclic redundancy check (CRC) engine; and
        a second stream-wise CRC engine,
    wherein the copy engine is configured to:
        copy a first dataset received from the interface bus to the copy engine buffer as a first dataset copy;
        copy a second dataset received from the interface bus to the copy engine buffer as a second dataset copy;
        use the first stream-wise CRC engine to generate a first CRC value for the first dataset copy;
        use the second stream-wise CRC engine to generate a second CRC value for the second dataset copy; and transmit, via the interface bus to a processor of the computing device, a first stream-wise CRC message including the first dataset copy and the first CRC value and a second stream-wise CRC message including the second dataset copy and the second CRC value.

2. The computing device of claim 1, wherein the copy engine is further configured to use the second stream-wise CRC engine to generate the second CRC value for the second dataset copy in parallel with using the first stream-wise CRC engine to generate the first CRC value.

3. The computing device of claim 1, wherein the copy engine further comprises:
a memory-mapped subsystem configured to:
generate, based on a first communication message, a first source ring descriptor including a first source data pointer indicating a memory location of the first dataset; and
generate, based on a second communication message, a second source ring descriptor including a second source data pointer indicating a memory location of the second dataset.

4. The computing device of claim 3, wherein the copy engine is further configured to:
copy the first dataset to the copy engine buffer based on the first source data pointer, and
copy the second dataset to the copy engine buffer based on the second source data pointer.

5. The computing device of claim 3, wherein the copy engine is further configured such that:
the first source ring descriptor includes a first length bit indicating a length of the first dataset, a first gather bit indicating the first CRC value is generated as part of a first dataset stream including multiple datasets, and a first CRC type indicating a first communication protocol; and
the second source ring descriptor includes a second length bit indicating a length of the second dataset, a second gather bit indicating the second CRC value is generated as part of a second dataset stream including multiple datasets, and a second CRC type indicating a second communication protocol.

6. The computing device of claim 1, wherein the copy engine is further configured to:
use the first stream-wise CRC engine to generate the first CRC value for the first dataset copy based on a first CRC type indicating a first communication protocol, and
use the second stream-wise CRC engine to generate the second CRC value for the second dataset copy based on a second CRC type indicating a second communication protocol,
wherein the first CRC type and the second CRC type are different CRC types.

7. The computing device of claim 1, wherein the copy engine further comprises:
a memory-mapped subsystem configured to:
generate a first status ring descriptor including the first CRC value and a first status bit;
generate a second status ring descriptor including the second CRC value and a second status bit;
set the first status bit in response to the first stream-wise CRC engine generating the first CRC value; and
set the second status bit in response to the second stream-wise CRC engine generating the second CRC value, wherein the copy engine is further configured to:
transmit the first stream-wise CRC message via the interface bus in response to the memory-mapped subsystem setting the first status bit; and
transmit the second stream-wise CRC message via the interface bus in response to the memory-mapped subsystem setting the second status bit.

8. The computing device of claim 1, further comprising:
a memory-mapped subsystem configured to:
generate a first destination ring descriptor including a first destination data pointer; and
generate a second destination ring descriptor including a second destination data pointer,
wherein the copy engine is further configured to:
transmit the first stream-wise CRC message via the interface bus based on the first destination data pointer; and
transmit the second stream-wise CRC message via the interface bus based on the second destination data pointer.

9. The computing device of claim 1, wherein the copy engine is further configured to:
copy a third dataset received from the interface bus to the copy engine buffer as a third dataset copy;
use the first stream-wise CRC engine to generate a final CRC value using the third dataset copy and the first CRC value; and
transmit, via the interface bus to the processor, the first stream-wise CRC message including the first dataset copy, the third dataset copy, and the final CRC value.

10. A method performed by a copy engine of a computing device for generating a cyclic redundancy check (CRC) in a safety network, comprising:
copying, in hardware of the copy engine, a first dataset received from an interface bus to obtain a first dataset copy;
copying, in hardware of the copy engine, a second dataset received from the interface bus to obtain a second dataset copy;
generating, via a first stream-wise CRC engine in the hardware of the copy engine, a first CRC value for the first dataset copy and, in parallel, generating, via a second stream-wise CRC engine in the hardware of the copy engine, a second CRC value for the second dataset copy;
transmitting, to a processor of the computing device, a first stream-wise CRC message including the first dataset copy and the first CRC value; and
transmitting, to the processor, a second stream-wise CRC message including the second dataset copy and the second CRC value.

11. The method of claim 10, further comprising:
generating, based on a first communication message, a first source ring descriptor including a first source data pointer indicating a memory location of the first dataset; and
generating, based on a second communication message, a second source ring descriptor including a second source data pointer indicating a memory location of the second dataset.

12. The method of claim 11, wherein:
copying, in hardware of the copy engine, the first dataset received from the interface bus to obtain the first dataset copy further comprises copying the first dataset based on the first source data pointer, and
copying, in hardware of the copy engine, the second dataset received from the interface bus to obtain the second dataset copy further comprises copying the second dataset based on the second source data pointer.

13. The method of claim 11, wherein the first source ring descriptor includes a first length bit indicating a length of the first dataset, a first gather bit indicating the first CRC value is generated as part of a first dataset stream including multiple datasets, and a first CRC type indicating a first communication protocol, and wherein the second source ring descriptor includes a second length bit indicating a length of the second dataset, a second gather bit indicating the second CRC value is generated as part of a second dataset stream including multiple datasets, and a second CRC type indicating a second communication protocol.

14. The method of claim 10, wherein:
generating, via the first stream-wise CRC engine, the first CRC value for the first dataset copy further comprises generating, via the first stream-wise CRC engine, the first CRC value for the first dataset copy based on a first CRC type indicating a first communication protocol, and
generating, via the second stream-wise CRC engine, the second CRC value for the second dataset copy further comprises generating, via the second stream-wise CRC engine, the second CRC value for the second dataset copy based on a second CRC type indicating a second communication protocol.

15. The method of claim 14, wherein the first CRC type and the second CRC type are different CRC types.

16. The method of claim 10, further comprising:
generating a first status ring descriptor including the first CRC value and a first status bit;
generating a second status ring descriptor including the second CRC value and a second status bit;
setting the first status bit after generating the first CRC value, wherein transmitting the first stream-wise CRC message is performed in response to setting the first status bit; and
setting the second status bit after generating the second CRC value, wherein transmitting the second stream-wise CRC message is performed in response to setting the second status bit.

17. The method of claim 10, further comprising:
generating a first destination ring descriptor including a first destination data pointer; and
generating a second destination ring descriptor including a second destination data pointer,
wherein:
transmitting the first stream-wise CRC message further comprises transmitting the first stream-wise CRC message based on the first destination data pointer, and
transmitting the second stream-wise CRC message further comprises transmitting the second stream-wise CRC message based on the second destination data pointer.

18. The method of claim 10, further comprising:
copying, in hardware of the copy engine, a third dataset received from the interface bus to obtain a third dataset copy,
wherein generating, via the first stream-wise CRC engine in the hardware of the copy engine, the first CRC value for the first dataset copy and, in parallel generating, via the second stream-wise CRC engine in the hardware of the copy engine, the second CRC value for the second dataset copy further comprises generating, via the first stream-wise CRC engine, a final CRC value, wherein the final CRC value is generated using the third dataset copy and the first CRC value, and
wherein transmitting, to the processor, the first stream-wise CRC message further comprises transmitting, to the processor, the first stream-wise CRC message including the first dataset copy, the third dataset copy, and the final CRC value.

19. A copy engine of a computing device, comprising:
means for copying a first dataset received from an interface bus to obtain a first dataset copy;
means for copying a second dataset received from the interface bus to obtain a second dataset copy;
means for generating a first CRC value for the first dataset copy and a second CRC value for the second dataset copy in parallel;
means for transmitting, to a processor of the computing device, a first stream-wise CRC message including the first dataset copy and the first CRC value; and
means for transmitting, to the processor, a second stream-wise CRC message including the second dataset copy and the second CRC value.

20. The copy engine of claim 19, further comprising:
means for generating, based on a first communication message, a first source ring descriptor including a first source data pointer indicating a memory location of the first dataset; and
means for generating, based on a second communication message, a second source ring descriptor including a second source data pointer indicating a memory location of the second dataset.

21. The copy engine of claim 20, wherein:
means for copying the first dataset received from the interface bus to obtain the first dataset copy further comprises means for copying the first dataset based on the first source data pointer, and
means for copying the second dataset received from the interface bus to obtain the second dataset copy further comprises means for copying the second dataset based on the second source data pointer.

22. The copy engine of claim 20, wherein:
the first source ring descriptor includes a first length bit indicating a length of the first dataset, a first gather bit indicating the first CRC value is generated as part of a first dataset stream including multiple datasets, and a first CRC type indicating a first communication protocol; and
the second source ring descriptor includes a second length bit indicating a length of the second dataset, a second gather bit indicating the second CRC value is generated as part of a second dataset stream including multiple datasets, and a second CRC type indicating a second communication protocol.

23. The copy engine of claim 19, wherein:
means for generating the first CRC value for the first dataset copy further comprises means for generating the first CRC value for the first dataset copy based on a first CRC type indicating a first communication protocol; and
means for generating the second CRC value for the second dataset copy further comprises means for generating the second CRC value for the second dataset copy based on a second CRC type indicating a second communication protocol.

24. The copy engine of claim 23, wherein the first CRC type and the second CRC type are different CRC types.

25. The copy engine of claim 19, further comprising:
means for generating a first status ring descriptor including the first CRC value and a first status bit;
means for generating a second status ring descriptor including the second CRC value and a second status bit;
means for setting the first status bit after generating the first CRC value, wherein transmitting the first stream-wise CRC message is performed in response to setting the first status bit; and
means for setting the second status bit after generating the second CRC value, wherein transmitting the second stream-wise CRC message is performed in response to setting the second status bit.

26. The copy engine of claim 19, further comprising:
means for generating a first destination ring descriptor including a first destination data pointer; and
means for generating a second destination ring descriptor including a second destination data pointer,
wherein:
    means for transmitting the first stream-wise CRC message comprises means for transmitting the first stream-wise CRC message based on the first destination data pointer, and
    means for transmitting the second stream-wise CRC message comprises means for transmitting the second stream-wise CRC message based on the second destination data pointer.

27. The copy engine of claim 19, further comprising means for copying a third dataset received from the interface bus to obtain a third dataset copy, wherein:
    means for generating the first CRC value for the first dataset copy and the second CRC value for the second dataset copy in parallel comprises means for generating a final CRC value using the third dataset copy and the first CRC value; and
    means for transmitting, to the processor, the first stream-wise CRC message comprises means for transmitting, to the processor, the first stream-wise CRC message including the first dataset copy, the third dataset copy, and the final CRC value.

28. A non-transitory processor-executable medium having stored thereon processor-executable instructions configured to cause a copy engine of a computing device to perform operations comprising:
    copying, in hardware of the copy engine, a first dataset received from an interface bus to obtain a first dataset copy;
    copying, in hardware of the copy engine, a second dataset received from the interface bus to obtain a second dataset copy;
    generating, via a first stream-wise CRC engine in the hardware of the copy engine, a first CRC value for the first dataset copy and, in parallel, generating, via a second stream-wise CRC engine in the hardware of the copy engine, a second CRC value for the second dataset copy;
    transmitting, to a processor of the computing device, a first stream-wise CRC message including the first dataset copy and the first CRC value; and
    transmitting, to the processor, a second stream-wise CRC message including the second dataset copy and the second CRC value.

29. The non-transitory processor-executable medium of claim 28, wherein the stored processor-executable instructions are further configured to cause the copy engine of the computing device to perform operations further comprising:
    generating, based on a first communication message, a first source ring descriptor including a first source data pointer indicating a memory location of the first dataset; and
    generating, based on a second communication message, a second source ring descriptor including a second source data pointer indicating a memory location of the second dataset.

30. The non-transitory processor-executable medium of claim 29, wherein the stored processor-executable instructions are further configured to cause the copy engine of the computing device to perform operations such that:
    copying, in hardware of the copy engine, the first dataset received from the interface bus to obtain the first dataset copy further comprises copying the first dataset based on the first source data pointer, and
    copying, in hardware of the copy engine, the second dataset received from the interface bus to obtain the second dataset copy further comprises copying the second dataset based on the second source data pointer.

* * * * *